(12) United States Patent
Matsumaru et al.

(10) Patent No.: US 8,349,543 B2
(45) Date of Patent: Jan. 8, 2013

(54) PATTERN-FORMING METHOD, METAL OXIDE FILM-FORMING MATERIAL AND METHOD FOR USING THE METAL OXIDE FILM-FORMING MATERIAL

(75) Inventors: Shogo Matsumaru, Kawasaki (JP); Ryoji Watanabe, Kawasaki (JP); Toshiyuki Ogata, Kawasaki (JP)

(73) Assignee: Tokyo Ohka Kogyo Co. Ltd., Kawasaki-shi (JP)

( * ) Notice: Subject to any disclaimer, the term of this patent is extended or adjusted under 35 U.S.C. 154(b) by 658 days.

(21) Appl. No.: 12/373,714

(22) PCT Filed: Jun. 18, 2007

(86) PCT No.: PCT/JP2007/062221
§ 371 (c)(1),
(2), (4) Date: Jan. 13, 2009

(87) PCT Pub. No.: WO2008/015848
PCT Pub. Date: Feb. 7, 2008

(65) Prior Publication Data
US 2010/0003622 A1    Jan. 7, 2010

(30) Foreign Application Priority Data
Jul. 31, 2006  (JP) ................................ 2006-208919

(51) Int. Cl.
*G03F 7/26*  (2006.01)
*C09D 5/00*  (2006.01)
(52) U.S. Cl. ............... 430/315; 430/394; 106/287.11
(58) Field of Classification Search ............... 430/312, 430/314, 394
See application file for complete search history.

(56) References Cited

U.S. PATENT DOCUMENTS

| | | | |
|---|---|---|---|
| 4,865,649 A | | 9/1989 | Kashiwagi et al. |
| 4,888,203 A | * | 12/1989 | Rothschild et al. ............ 427/584 |
| 5,496,402 A | | 3/1996 | Sakamoto et al. |
| 6,110,269 A | * | 8/2000 | Sugawara et al. ........ 106/287.19 |

(Continued)

FOREIGN PATENT DOCUMENTS

JP   63-5530 A   1/1988

(Continued)

OTHER PUBLICATIONS

Ebihara, Takeaki, Beyond k1=0.25 lithography : 70nm L/S patterning using KrF scanners, Proceedings of SPIE vol. 5256 23rd Annual BACUS Symposium on Photomask Technology, pp. 985 to 994 (2003).

(Continued)

*Primary Examiner* — Kathleen Duda
*Assistant Examiner* — Caleen Sullivan
(74) *Attorney, Agent, or Firm* — Knobbe Martens Olson & Bear LLP

(57) ABSTRACT

A pattern-forming method, including: forming a first resist film by applying a first chemically amplified resist composition onto a support, forming a plurality of resist patterns by selectively exposing and then developing the first resist film, forming a plurality of coated patterns by forming a coating film composed of a metal oxide film on the surface of each resist pattern, forming a second resist film by applying a second chemically amplified resist composition onto the support having the coated patterns formed thereon, and selectively exposing and then developing the second resist film, thereby forming a pattern composed of the plurality of coated patterns and a resist pattern formed in the second resist film onto the support.

6 Claims, 2 Drawing Sheets

U.S. PATENT DOCUMENTS

| | | |
|---|---|---|
| 7,323,287 B2 | 1/2008 | Iwai et al. |
| 2004/0058270 A1 | 3/2004 | Iwai et al. |
| 2005/0026446 A1* | 2/2005 | Wu et al. .................. 438/708 |
| 2009/0134119 A1* | 5/2009 | Matsumaru et al. ............ 216/49 |

FOREIGN PATENT DOCUMENTS

| | | |
|---|---|---|
| JP | H08-003074 | 10/1988 |
| JP | 4-71222 A | 3/1992 |
| JP | 2739902 | 4/1995 |
| JP | 3228714 | 9/1999 |
| JP | 2001-135565 A | 5/2001 |
| JP | 2002-211157 A | 7/2002 |
| JP | 2003-167346 | 6/2003 |
| JP | 2003-241385 | 8/2003 |
| JP | 2004-315771 | 11/2004 |
| JP | 2006-91888 A | 4/2006 |

OTHER PUBLICATIONS

Borodovsky, Yan, Marching to the beat of Moore's Law, Proceedings of SPIE vol. 6153 615301-1 to 615301-19 (2006).

Optronics "$F_2$ lithography and resolution enhancement techniques," No. 4, pp. 117-121 (2003).

International Search report issued on Jul. 24, 2007 in the corresponding PCT application No. PCT/JP2007/062221.

* cited by examiner

PATTERN-FORMING METHOD, METAL OXIDE FILM-FORMING MATERIAL AND METHOD FOR USING THE METAL OXIDE FILM-FORMING MATERIAL

RELATED APPLICATIONS

This application is the U.S. National Phase filing under 35 U.S.C. §371 of PCT/JP2007/062221, filed Jun. 18, 2007, which designated the United States and was published in a language other than English, which claims priority under 35 U.S.C. §119(a)-(d) to Japanese Patent Application Ser. No. 2006-208919, filed Jul. 31, 2006. The contents of these applications are incorporated herein by reference in their entireties.

TECHNICAL FIELD

The present invention relates to a pattern-forming method in which a pattern is formed using a double patterning method, a metal oxide film-forming material that can be used favorably in the pattern-forming method, and a method for using the metal oxide film-forming material.

BACKGROUND ART

Techniques (pattern-forming techniques) in which a fine pattern is formed on top of a substrate, and a lower layer beneath that pattern is then fabricated by conducting etching with this pattern as a mask are widely used in the semiconductor industry for IC fabrication and the like, and are attracting considerable attention.

These fine patterns are typically formed from an organic material, and are formed, for example, using a lithography method or a nanoimprint method or the like. For example, in the case of a lithography method, a process is conducted in which a resist film formed from a resist composition containing a base component such as a resin is formed on top of a support such as a substrate, the resist film is subjected to selective exposure using radiation such as light or an electron beam, through a mask in which a predetermined pattern has been formed (a mask pattern), and a developing treatment is then conducted, thereby forming a resist pattern of predetermined shape in the resist film. Resist compositions in which the exposed portions change to become soluble in the developing solution are termed positive compositions, whereas resist compositions in which the exposed portions change to become insoluble in the developing solution are termed negative compositions.

Then, using this resist pattern as a mask, a semiconductor device or the like is produced by conducting a step in which the substrate is processed by etching.

In recent years, advances in lithography techniques have lead to rapid progress in the field of pattern miniaturization. Typically, these miniaturization techniques involve shortening the wavelength of the exposure light source. Conventionally, ultraviolet radiation typified by g-line and i-line radiation has been used, but nowadays semiconductor device mass production using KrF excimer lasers and ArF excimer lasers has already commenced, and for example, lithography using ArF excimer lasers has enabled pattern formation with resolution at the 45 nm level. Furthermore, in order to further improve the resolution, research is also being conducted into lithography techniques that use exposure light sources having a wavelength shorter than these excimer lasers, such as $F_2$ excimer lasers, electron beams, EUV (extreme ultraviolet radiation), and X rays.

The resist composition requires lithography properties such as a high level of sensitivity to these types of exposure sources, and a high resolution capable of reproducing patterns of minute dimensions. As a resist material which satisfies these requirements, a chemically amplified resist composition is used, which includes a base component that exhibits changed alkali solubility under the action of acid and an acid generator that generates acid upon exposure (for example, see Patent Document 1). For example, a positive chemically amplified resist typically contains, as a base component, a resin which exhibits increased alkali solubility under the action of acid, and during formation of a resist pattern, when acid is generated from the acid generator upon exposure, the exposed portions of the resist become alkali-soluble.

As a technique for further improving the resolution, a lithography method called liquid immersion lithography (hereafter, frequently referred to as "immersion exposure") is known in which exposure (immersion exposure) is conducted in a state where the region between the objective lens of the exposure apparatus and the sample is filled with a solvent (an immersion medium) that has a larger refractive index than the refractive index of air (see, for example, Non-Patent Document 1).

According to this type of immersion exposure, it is considered that higher resolutions equivalent to those obtained using a shorter wavelength light source or a larger NA (numerical aperture) lens can be achieved using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift methods and modified illumination methods. Currently, as the immersion exposure technique, techniques using an ArF excimer laser as an exposure source are being the most actively studied. Further, water is mainly being investigated as the immersion medium.

Recently, a new lithography technique called the double patterning method has been proposed, in which a pattern is formed by conducting patterning two or more times (see, for example, Non-Patent Documents 2 and 3). It is considered that by using this double patterning method, a pattern can be formed that is finer than a pattern formed using only a single patterning step. For example, in Non-Patent Document 2, a method such as that shown in FIG. 2A through FIG. 2F is disclosed.

In other words, first, as shown in FIG. 2A, a laminate is prepared by laminating a substrate 101, a lower layer film 102, and a hard mask 103.

Next, a resist film is provided on top of the hard mask 103, and as shown in FIG. 2B, by selectively irradiating the resist film through a mask 105 and then performing developing, a resist pattern 104 is formed in which a plurality of trench patterns having a space width of d/4 are arranged at a pitch of d.

Subsequently, the hard mask 103 is etched using the resist pattern 104 as a mask, and the residual resist pattern 104 is then removed. As shown in FIG. 2C, this yields a hard mask 103' to which the resist pattern has been transferred.

Next, as shown in FIG. 2D, the position of the mask 105 is shifted, and a resist material is coated onto the hard mask 103', thereby filling the spaces within the hard mask 103', and forming a thick-film resist film having a thickness greater than the thickness of the hard mask 103'. This resist film is selectively exposed through the shifted mask 105 and then developed, thereby forming a resist pattern 106.

Subsequently, the hard mask 103' is etched using the resist pattern 106 as a mask, and the residual resist pattern 106 is then removed. As shown in FIG. 2E, this yields a hard mask 103" having a transferred pattern in which a plurality of trench patterns having a space width of d/4 are arranged at a pitch of d/2.

Then, by conducting etching with the hard mask 103" as a mask, the pattern of the hard mask 103" is transferred to the lower layer film 102, enabling the formation of a pattern 102' shown in FIG. 2F in which the pitch is ½ of that of the mask 105 that was used.

In this manner, according to the double patterning method, a resist pattern of higher resolution can be formed, even if a light source having the same exposure wavelength is used, and even if the same resist composition is used. Further, the double patterning method can also be used with existing exposure apparatus.

[Patent Reference 1]
Japanese Unexamined Patent Application, First Publication No. 2003-241385
[Non-Patent Document 1]
Optronics 2003, No. 4, pp. 117 to 121 (2003)
[Non-Patent Document 2]
Proceedings of SPIE, vol. 5256, pp. 985 to 994 (2003)
[Non-Patent Document 3]
Proceedings of SPIE, vol. 6153, pp. 615301-1 to 615301-19 (2006)

DISCLOSURE OF INVENTION

Problems to be Solved by the Invention

However, in conventional double patterning methods, generally, a lower layer film must be provided on top of the substrate. Further, in order to enable the formation of a pattern on the substrate, patterning of the resist film must be conducted at least twice, and etching of the hard mask positioned underneath must be conducted at least twice.

The present invention takes the above circumstances into consideration, with an object of providing a novel pattern-forming method that enables a reduction in the number of steps in a double patterning method, a metal oxide film-forming material that can be used favorably in the pattern-forming method, and a method for using the metal oxide film-forming material.

MEANS TO SOLVE THE PROBLEMS

In order to achieve the above object, the present invention adopts the aspects described below.

Namely, a first aspect of the present invention is a pattern-forming method, including:

forming a first resist film by applying a first chemically amplified resist composition onto a support, forming a first resist pattern by selectively exposing the first resist film through a first mask pattern and then developing the first resist film, forming a coated pattern by forming a coating film including a metal oxide film on the surface of the first resist pattern, forming a second resist film by applying a second chemically amplified resist composition onto the support having the coated pattern formed thereon, and forming a pattern by selectively exposing the second resist film through a second mask pattern and then developing the second resist film.

A second aspect of the present invention is a metal oxide film-forming material, which includes:

a metal compound (W) capable of generating a hydroxyl group upon hydrolysis, and an organic solvent (S'), is prepared by dissolving the metal compound (W) in the organic solvent (S'), and is used for forming the coating film in the pattern-forming method of the first aspect described above.

A third aspect of the present invention is a method for using a metal oxide film-forming material wherein in a pattern-forming method including: forming a first resist film by applying a first chemically amplified resist composition onto a support, forming a first resist pattern by selectively exposing the first resist film through a first mask pattern and then developing the first resist film, forming a coated pattern by forming a coating film including a metal oxide film on the surface of the first resist pattern, forming a second resist film by applying a second chemically amplified resist composition onto the support having the coated pattern formed thereon, and forming a pattern by selectively exposing the second resist film through a second mask pattern and then developing the second resist film, the metal oxide film-forming material is used for forming the coating film, and the metal oxide film-forming material includes a metal compound (W) capable of generating a hydroxyl group upon hydrolysis, and an organic solvent (S'), and is prepared by dissolving the metal compound (W) in the organic solvent (S').

In this description and within the scope of the appended claims, the term "exposure" is a general concept that includes irradiation with any form of radiation.

EFFECT OF THE INVENTION

The present invention is able to provide a novel pattern-forming method that enables a reduction in the number of steps in a double patterning method, a metal oxide film-forming material that can be used favorably in the pattern-forming method, and a method for using the metal oxide film-forming material

DESCRIPTION OF THE REFERENCE SYMBOLS

Figure 1A:
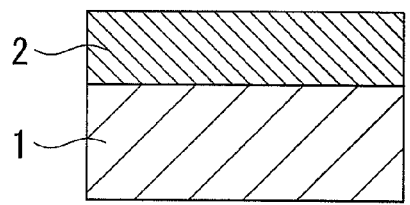
FIG. 1A is a schematic process diagram describing a preferred embodiment of the pattern-forming method of the present invention, and describes a film formation step (1).

| | |
|---|---|
| 1 | Support |
| 2 | First resist film |
| 3 | First resist pattern |
| 4 | Coating film |
| 5 | Coated pattern |
| 6 | Second resist film |
| 7 | Second resist pattern |
| 101 | Substrate |
| 102 | Lower layer film |
| 103 | Hard mask |
| 104 | Resist pattern |
| 105 | Mask |
| 106 | Resist pattern |

BEST MODE FOR CARRYING OUT THE INVENTION

<<Pattern-Forming Method>>

A pattern-forming method of the present invention is a pattern-forming method that uses a chemically amplified resist composition.

There are no particular restrictions on the chemically amplified resist composition, which may be selected from the multitude of conventional chemically amplified resist compositions that have been proposed for use as resist compositions, in accordance with factors such as the type of exposure light source being used and the lithography properties of the composition.

The chemically amplified resist composition may be either a negative resist composition or a positive resist composition, although a positive resist composition is preferred.

As the chemically amplified resist composition, a composition containing a base component (A) that exhibits changed alkali solubility under the action of acid (hereafter frequently referred to as "component (A)") and an acid generator component (B) that generates acid upon exposure (hereafter frequently referred to as "component (B)") dissolved in an organic solvent (S) (hereafter frequently referred to as "component (S)") is typical.

Here, the term "base component" describes an organic compound having a film-forming ability, and is preferably an organic compound having a molecular weight of 500 or more. When the organic compound has a molecular weight of 500 or more, the film-forming ability is improved, and a nano level pattern can be more easily formed.

These organic compounds having a molecular weight of 500 or more are broadly classified into low molecular weight organic compounds having a molecular weight of at least 500 but less than 2,000 (hereafter, frequently referred to as "low molecular weight compounds") and high molecular weight resins (polymers) having a molecular weight of 2,000 or more. Generally, as the aforementioned low molecular weight compound, a non-polymer (monomer) is used. In the case of a resin (polymer), the "molecular weight" is reported as the polystyrene equivalent weight average molecular weight determined by GPC (gel permeation chromatography). Hereafter, the simplified term "resin" is used to refer to a resin having a molecular weight of 2,000 or more.

The component (A) may be a low molecular weight compound that exhibits changed alkali solubility under the action of acid, a resin that exhibits changed alkali solubility under the action of acid, or a mixture thereof.

As the component (A), generally, either a single organic compound that is typically used as a base component for a chemically amplified resist is used alone, or a mixture of two or more such compounds may be used.

As the component (A) of the chemically amplified resist composition used in the present invention, a component having a hydrophilic group is preferred. Including a hydrophilic group means that when a resist pattern is formed using the chemically amplified resist composition, a coating film with superior adhesion can be formed uniformly on top of the resist pattern. In other words, including a hydrophilic group within the component (A) means that hydrophilic groups will exist at the surface of the resist pattern. These hydrophilic groups function as functional groups (reactive groups) that are capable of bonding strongly to a metal oxide film formed on top of the resist pattern, enabling a high-density coating film to be formed uniformly on top of the resist pattern.

The hydrophilic group within the component (A) is preferably one or more groups selected from the group consisting of a hydroxyl group, carboxyl group, carbonyl group (—C(O)—), ester group (an ester linkage; —C(O)—O—), amino group and amide group. Of these groups, a hydroxyl group (and particularly an alcoholic hydroxyl group or phenolic hydroxyl group), a carboxyl group, and an ester group are particularly preferred.

Of these, a carboxyl group, alcoholic hydroxyl group or phenolic hydroxyl group forms a coating layer more readily on the pattern surface, and is consequently preferred. Furthermore, these groups also enable the formation of a pattern with minimal line edge roughness (unevenness within the pattern side walls) at the nano level.

The quantity of the hydrophilic group within the component (A) affects the quantity of hydrophilic groups per unit of surface area at the pattern surface. Accordingly, this quantity of the hydrophilic group affects the adhesion and density of the coating film formed on the pattern.

In those cases where the component (A) is a low molecular weight compound, the component (A) is preferably a low molecular weight compound in which each molecule contains from 1 to 20 equivalents, and even more preferably 2 to 10 equivalents, of the hydrophilic group. Here, the expression "each molecule contains from 1 to 20 equivalents of the hydrophilic group" means that from 1 to 20 of the hydrophilic groups exist within each molecule.

In those cases where the component (A) is a resin, the component (A) preferably contains at least 0.2 equivalents of the hydrophilic group, and this quantity is even more preferably within a range from 0.5 to 0.8 equivalents, and is most preferably from 0.6 to 0.75 equivalents. This means that if the resin is assumed to be formed from a structural unit containing a hydrophilic group and another structural unit, then the quantity of the former structural unit is at least 20 mol %, preferably within a range from 50 to 80 mol %, and is most preferably from 60 to 75 mol %.

In the present invention, the terms "structural unit" and "unit" refer to a monomer unit that contributes to the formation of a resin (polymer).

When the chemically amplified resist composition is a negative resist composition, a base component that exhibits reduced alkali solubility under the action of acid is used as the component (A), and a cross-linker is also blended into the negative resist composition.

In the negative resist composition, when acid is generated from the component (B) upon exposure, the action of this acid causes cross-linking between the component (A) and the cross-linker, and the component (A) changes from an alkali-soluble state to an alkali-insoluble state. Accordingly, during the formation of a resist pattern, if a resist film obtained by applying the negative resist composition to a substrate is selectively exposed, then the exposed portions become alkali-insoluble, whereas the unexposed portions remain alkali-soluble, meaning alkali developing can then be conducted.

As the component (A) of the negative resist composition, an alkali-soluble resin is generally used, and as this alkali-soluble resin, it is preferable to use a resin having a structural unit derived from at least one of an α-(hydroxyalkyl)acrylic acid and a lower alkyl ester of an α-(hydroxyalkyl)acrylic acid, as such a resin enables formation of a satisfactory resist pattern with minimal swelling. Here, the term "α-(hydroxyalkyl)acrylic acid" refers to one or both of acrylic acid, in which a hydrogen atom is bonded to the carbon atom on the α-position having the carboxyl group bonded thereto, and the α-hydroxyalkylacrylic acid, in which a hydroxyalkyl group (and preferably a hydroxyalkyl group of 1 to 5 carbon atoms) is bonded to the carbon atom on the α-position.

As the cross-linker, an amino-based cross-linking agent such as a glycoluril having a methylol group or alkoxymethyl group is generally preferable, as it enables formation of a favorable resist pattern with minimal swelling. The quantity added of the cross-linker is preferably within a range from 1 to 50 parts by weight per 100 parts by weight of the alkali-soluble resin.

When the chemically amplified resist composition is a positive resist composition, a base component that has acid dissociable, dissolution inhibiting groups and exhibits increased alkali solubility under the action of acid is used as the component (A).

The positive resist composition is alkali-insoluble prior to exposure, but during resist pattern formation, when acid is generated from the component (B) upon exposure, the acid dissociable, dissolution inhibiting groups are dissociated by the action of the generated acid, and the component (A) becomes alkali-soluble. Accordingly, during the formation of a resist pattern, by conducting selective exposure of a resist film obtained by applying the positive resist composition onto a substrate, the exposed portions become alkali-soluble, whereas the unexposed portions remain alkali-insoluble, meaning alkali developing can then be conducted.

As the component (A) of the positive resist composition, a component that includes both a hydrophilic group and an acid dissociable, dissolution inhibiting group is preferred, and a component (A-1) and/or a component (A-2) described below are particularly desirable. The hydrophilic group may also act as the acid dissociable, dissolution inhibiting group.

Component (A-1): a resin having hydrophilic groups and acid dissociable, dissolution inhibiting groups.

Component (A-2): a low-molecular compound having a hydrophilic group and an acid dissociable, dissolution inhibiting group.

Preferred embodiments of the component (A-1) and the component (A-2) are described below in more detail.

[Component (A-1)]

As the component (A-1), a resin containing a structural unit having a hydrophilic group and a structural unit having an acid dissociable, dissolution inhibiting group is preferred.

In this resin, the proportion of the structural unit having a hydrophilic group, relative to the combined total of all the structural units that constitute the resin, is preferably within a range from 20 to 80 mol %, more preferably from 20 to 70 mol %, and still more preferably from 20 to 60 mol %.

The proportion within the resin of the structural unit having an acid dissociable, dissolution inhibiting group, relative to the combined total of all the structural units that constitute the resin, is preferably within a range from 20 to 80 mol %, more preferably from 20 to 70 mol %, and still more preferably from 30 to 60 mol %.

The structural unit having a hydrophilic group is preferably a structural unit having a carboxyl group, alcoholic hydroxyl group or phenolic hydroxyl group, and is more preferably a unit derived from acrylic acid, methacrylic acid, an (α-lower alkyl)acrylate ester having an alcoholic hydroxyl group, or hydroxystyrene.

As the component (A-1), more specifically, novolak resins, hydroxystyrene-based resins, (α-lower alkyl)acrylate ester resins, and copolymer resins containing structural units derived from hydroxystyrene and structural units derived from an (α-lower alkyl)acrylate ester, which contain a hydrophilic group and an acid dissociable, dissolution inhibiting group, can be used favorably.

In the present description, the term "(α-lower alkyl)acrylic acid" refers to one or both of acrylic acid ($CH_2$=CH—COOH) and α-lower alkyl acrylic acid.

An "α-lower alkyl acrylic acid" refers to a compound in which the hydrogen atom bonded to the carbon atom (the carbon atom on the α-position) that is bonded to the carbonyl group of the acrylic acid is substituted with a lower alkyl group. An "(α-lower alkyl)acrylate ester" is an ester derivative of the "(α-lower alkyl)acrylic acid", and refers to one or both of the acrylate ester and the α-lower alkyl acrylate ester.

A "structural unit derived from an (α-lower alkyl) acrylate ester" is a structural unit that is formed by cleavage of the ethylenic double bond of an (α-lower alkyl)acrylate ester, and hereafter may also be referred to as an "(α-lower alkyl)acrylate structural unit". The term "(α-lower alkyl)acrylate" refers to one or both of the acrylate and the a lower alkyl acrylate.

With respect to the "structural unit derived from an acrylate ester", the "α-position (the carbon atom on the α-position)" refers to the carbon atom having the carbonyl group bonded thereto, unless specified otherwise.

A "structural unit derived from hydroxystyrene" is a structural unit that is formed by cleavage of the ethylenic double bond of hydroxystyrene or an α-lower alkyl hydroxystyrene, and hereafter may also be referred to as a "hydroxystyrene unit". An "α-lower alkyl hydroxystyrene" refers to a compound in which a lower alkyl group is bonded to the carbon atom to which the phenyl group is bonded.

In a "structural unit derived from an α-lower alkyl acrylate ester" and a "structural unit derived from an α-lower alkyl hydroxystyrene", the lower alkyl group bonded to the α-position is an alkyl group of 1 to 5 carbon atoms, and is preferably a linear or branched alkyl group. Examples include a methyl group, ethyl group, propyl group, isopropyl group, n-butyl group, isobutyl group, tert-butyl group, pentyl group, isopentyl group, and neopentyl group. A methyl group is preferred industrially.

Although there are no particular restrictions on preferred resin components for use as the component (A-1), suitable examples include resin components (hereafter frequently referred to as "component (A-11)") that include a unit containing a phenolic hydroxyl group, such as a structural unit (a1) described below, a structural unit containing an acid dissociable, dissolution inhibiting group, such as one or more units selected from the group consisting of a structural unit (a2) described below and a structural unit (a3) described below, and where necessary an alkali-insoluble unit such as a structural unit (a4).

In the component (A-11), the action of the acid generated from the acid generator upon exposure causes cleavage within the structural unit (a2) and/or the structural unit (a3), and this causes the resin, which was initially insoluble in an alkali developing solution, to undergo an increase in alkali solubility. As a result, exposure and developing can be used to form a chemically amplified positive pattern.

Structural Unit (a1)

The structural unit (a1) is a unit that contains a phenolic hydroxyl group, and is preferably a unit derived from hydroxystyrene, represented by general formula (I) shown below.

[Chemical Formula 1]

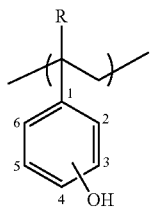

(I)

(wherein, R represents a hydrogen atom or a lower alkyl group.)

R represents either a hydrogen atom or a lower alkyl group. The lower alkyl group is as defined above for the lower alkyl group bonded to the α-position. R is preferably a hydrogen atom or a methyl group. This definition of R also applies below.

There are no particular restrictions on the bonding position of the —OH group to the benzene ring, although the position labeled 4 in the formula (the para position) is preferred.

From the viewpoint of forming a favorable pattern, the quantity of the structural unit (a1) within the component (A-11) is typically within a range from 40 to 80 mol %, and is preferably from 50 to 75 mol %. By ensuring that this quantity is at least 40 mol %, the solubility of the component in an alkali developing solution can be improved, and a favorable improvement in the pattern shape can also be obtained. Ensuring the quantity is not more than 80 mol % enables a favorable balance to be achieved with the other structural units.

Furthermore, in terms of forming a coating film on top of the pattern, the quantity of the structural unit (a1) within the component (A-11) is preferably at least 50 mol %, even more preferably at least 60 mol %, and is most preferably 75 mol % or greater. Although there are no particular restrictions on the upper limit, quantities of not more than 80 mol % are preferred. If the quantity falls within the above range, then the presence of the phenolic hydroxyl groups enables a favorable coating film to be formed on the pattern, and a favorable pattern shape can also be obtained. Furthermore, the adhesion between the pattern and the coating film is also favorable.

Structural Unit (a2)

The structural unit (a2) is a structural unit containing an acid dissociable, dissolution inhibiting group, and is represented by general formula (II) shown below.

[Chemical Formula 2]

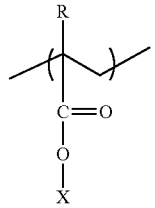

(II)

(wherein, R represents a hydrogen atom or a lower alkyl group, and X represents an acid dissociable, dissolution inhibiting group.)

Examples of the acid dissociable, dissolution inhibiting group X include alkyl groups with a tertiary carbon atom in which the tertiary carbon atom of that tertiary alkyl group is bonded to the ester group [—C(O)O—], as well as cyclic acetal groups such as a tetrahydropyranyl group and tetrahydrofuranyl group.

In addition to the groups described above, this type of acid dissociable, dissolution inhibiting group X may also be any of the groups typically used within chemically amplified positive resist compositions.

As the structural unit (a2), units such as those represented by general formula (III) shown below are preferred.

[Chemical Formula 3]

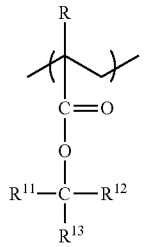

(III)

In this formula, R represents a hydrogen atom or a lower alkyl group, $R^{11}$, $R^{12}$ and $R^{13}$ each independently represents a lower alkyl group (which may be linear or branched, and is preferably a lower alkyl group of 1 to 5 carbon atoms). Furthermore, of the groups $R^{11}$, $R^{12}$ and $R^{13}$, $R^{11}$ may represent a lower alkyl group, and $R^{12}$ and $R^{13}$ may be bonded together to form a monocyclic or polycyclic aliphatic cyclic group. The number of carbon atoms within this aliphatic cyclic group is preferably from 5 to 12.

Here, the term "aliphatic" defines a group or compound that has no aromaticity, and an "aliphatic cyclic group" refers to a monocyclic or polycyclic group that has no aromaticity.

In those cases where $R^{11}$, $R^{12}$ and $R^{13}$ do not include an aliphatic cyclic group, units in which $R^{11}$, $R^{12}$ and $R^{13}$ all represent methyl groups are preferred.

In those cases where $R^{11}$, $R^{12}$ and $R^{13}$ do include an aliphatic cyclic group, then in those cases where the aliphatic cyclic group is a monocyclic aliphatic cyclic group, units having a cyclopentyl group or cyclohexyl group are preferred as the structural unit (a2).

In those cases where the aliphatic cyclic group is a polycyclic aliphatic cyclic group, examples of preferred forms of the structural unit (a2) include those units represented by general formula (IV) shown below.

[Chemical Formula 4]

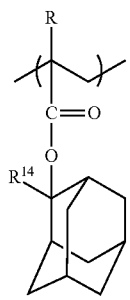

(IV)

[wherein, R represents a hydrogen atom or a lower alkyl group, and $R^{14}$ represents an alkyl group (which may be linear or branched, and preferably contains from 1 to 5 carbon atoms).]

Furthermore, as a structural unit containing an acid dissociable, dissolution inhibiting group that includes a polycyclic aliphatic cyclic group, units represented by general formula (V) shown below are preferred.

[Chemical Formula 5]

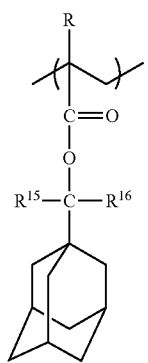

(V)

[wherein, R represents a hydrogen atom or a lower alkyl group, and $R^{15}$ and $R^{16}$ each independently represents an alkyl group (which may be linear or branched, and preferably contains from 1 to 5 carbon atoms).]

The quantity of the structural unit (a2) within the component (A-11) is typically within a range from 5 to 50 mol %, and is preferably from 10 to 40 mol %, and more preferably from 10 to 35 mol %.

Structural Unit (a3)

The structural unit (a3) is a structural unit containing an acid dissociable, dissolution inhibiting group, and is represented by general formula (VI) shown below.

[Chemical Formula 6]

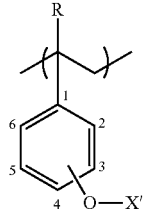

(VI)

(wherein, R represents a hydrogen atom or a lower alkyl group, and X' represents an acid dissociable, dissolution inhibiting group.)

Examples of the acid dissociable, dissolution inhibiting group X' include tertiary alkyloxycarbonyl groups such as a tert-butyloxycarbonyl group or tert-amyloxycarbonyl group, tertiary alkyloxycarbonylalkyl groups such as a tert-butyloxycarbonylmethyl group or tert-butyloxycarbonylethyl group, tertiary alkyl groups such as a tert-butyl group or tert-amyl group, cyclic acetal groups such as a tetrahydropyranyl group or tetrahydrofuranyl group, and alkoxyalkyl groups such as an ethoxyethyl group or methoxypropyl group.

Of these groups, a tert-butyloxycarbonyl group, tert-butyloxycarbonylmethyl group, tert-butyl group, tetrahydropyranyl group or ethoxyethyl group is preferred.

In addition to the groups listed above, the acid dissociable, dissolution inhibiting group X' can also use other groups typically used in chemically amplified positive resist compositions.

In general formula (VI), there are no particular restrictions on the position at which the (—OX') group is bonded to the benzene ring, although bonding at the position labeled 4 in the above formula (the para position) is preferred.

The quantity of the structural unit (a3) within the component (A-11) is typically within a range from 5 to 50 mol %, and is preferably from 10 to 40 mol %, and more preferably from 10 to 35 mol %.

Structural Unit (a4)

The structural unit (a4) is an alkali-insoluble unit, and is represented by a general formula (VII) shown below.

[Chemical Formula 7]

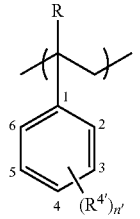

(VII)

(wherein, R represents a hydrogen atom or a lower alkyl group, $R^{4'}$ represents an alkyl group, and n' represents either 0 or an integer of 1 to 3.)

The alkyl group of $R^{4'}$ may be either linear or branched, and is preferably a lower alkyl group containing 1 to 5 carbon atoms. n' is either 0 or an integer of 1 to 3, and is preferably 0.

The quantity of the structural unit (a4) within the component (A-11) is typically within a range from 1 to 40 mol %, and is preferably from 5 to 25 mol %. By ensuring this quantity is at least 1 mol %, the level of improvement in the shape (and particularly the improvement in thickness loss) is enhanced, whereas ensuring the quantity is not more than 40 mol %. enables a favorable balance to be achieved with the other structural units.

The component (A-11) must contain the structural unit (a1) and at least one structural unit selected from the group consisting of the structural unit (a2) and the structural unit (a3), and may also contain a structural unit (a4). Furthermore, the component (A-11) may be a copolymer containing all of the structural units, or a mixture of a plurality of different polymers each containing at least one of the structural units. Combinations of these two possibilities are also possible.

Furthermore, the component (A-11) may also include other units besides the structural units (a1), (a2), (a3) and (a4) described above, although the structural units (a1), (a2), (a3) and (a4) preferably represent at least 80 mol %, and even more preferably at least 90 mol % (and most preferably 100 mol %) of the component (A-11).

The use of "a single copolymer containing the structural unit (a1) and the structural unit (a3), or a mixture of two or more different copolymers of this type", or "a single copolymer containing the structural units (a1), (a2) and (a4), or a mixture of two or more different copolymers of this type", or a mixture of these two configurations offers a simple way of achieving the desired effects, and is therefore the most preferred configuration. Furthermore, this configuration also offers a favorable improvement in the heat resistance.

A mixture of a polyhydroxystyrene protected with tertiary alkyloxycarbonyl groups and a polyhydroxystyrene protected with 1-alkoxyalkyl groups is particularly desirable. During mixing, the mixing ratio (weight ratio) between these copolymers (polyhydroxystyrene protected with tertiary alkyloxycarbonyl groups/polyhydroxystyrene protected with 1-alkoxyalkyl groups) is typically within a range from 1/9 to 9/1, is preferably from 2/8 to 8/2, and is more preferably from 2/8 to 5/5.

In terms of enabling formation of a pattern with a lower etching resistance, an example of a resin component (A-12) that is suitable as the component (A-1) but is different from the component (A-11) described above is a resin component that contains an (α-lower alkyl)acrylate ester resin, and resin components formed solely from an (α-lower alkyl)acrylate ester resin are particularly desirable.

Of these (α-lower alkyl)acrylate ester resins, a resin containing a structural unit (a5) derived from an (α-lower alkyl) acrylate ester containing an acid dissociable, dissolution inhibiting group is preferred. The α-lower alkyl group (the lower alkyl group bonded to the α-position) is as defined above.

The acid dissociable, dissolution inhibiting group of the structural unit (a5) has an alkali dissolution inhibiting effect that renders the entire component (A-12) alkali-insoluble prior to exposure, but then dissociates following exposure as a result of the action of the acid generated from the component (B), causing the entire component (A-12) to change to an alkali-soluble state.

Furthermore, in the (α-lower alkyl)acrylate ester resin component, when the acid dissociable, dissolution inhibiting group within the structural unit (a5) dissociates under the action of the acid generated from the component (B), a carboxylic acid is generated. The presence of this generated carboxylic acid improves the adhesion with the coating film formed on top of the resist pattern.

The acid dissociable, dissolution inhibiting group can be, for example, any of the multitude of groups that have been proposed for the resins used within resist compositions designed for use with ArF excimer lasers. Generally, groups that form a cyclic or chain-like tertiary alkyl ester, or a cyclic or chain-like alkoxyalkyl group, with the carboxyl group of the (α-lower alkyl)acrylic acid, are the most widely known.

Here, a "group that forms a tertiary alkyl ester" describes a group that forms an ester by substituting the hydrogen atom of the acrylic acid carboxyl group. In other words, a structure in which the tertiary carbon atom of a chain-like or cyclic tertiary alkyl group is bonded to the oxygen atom at the terminal of the carbonyloxy group [—C(O)—O—] of the acrylate ester. In this tertiary alkyl ester, the action of acid causes cleavage of the bond between the oxygen atom and the tertiary carbon atom.

A tertiary alkyl group refers to an alkyl group that includes a tertiary carbon atom.

Examples of groups that form a chain-like tertiary alkyl ester include a tert-butyl group and a tert-amyl group.

Examples of groups that form a cyclic tertiary alkyl ester include the same groups as those exemplified below in relation to the "acid dissociable, dissolution inhibiting group that contains an alicyclic group".

A "cyclic or chain-like alkoxyalkyl group" forms an ester by substitution with the hydrogen atom of a carboxyl group. In other words, a structure is formed in which the alkoxyalkyl group is bonded to the oxygen atom at the terminal of the carbonyloxy group [—C(O)—O—] of the acrylate ester. In this structure, the action of acid causes cleavage of the bond between the oxygen atom and the alkoxyalkyl group.

Examples of this type of cyclic or chain-like alkoxyalkyl group include a 1-methoxymethyl group, 1-ethoxyethyl group, 1-isopropoxyethyl group, 1-cyclohexyloxyethyl group, 2-adamantoxymethyl group, 1-methyladamantoxymethyl group, 4-oxo-2-adamantoxymethyl group, 1-adamantoxyethyl group, and 2-adamantoxyethyl group.

As the structural unit (a5), structural units that include an acid dissociable, dissolution inhibiting group that contains a cyclic group, and particularly an aliphatic cyclic group, are preferred.

Here, the terms "aliphatic" and "aliphatic cyclic group" are as defined above.

The aliphatic cyclic group may be either monocyclic or polycyclic, and can be selected appropriately from the multitude of groups proposed for use within ArF resists and the like. From the viewpoint of ensuring favorable etching resistance, a polycyclic alicyclic group is preferred. Furthermore, the alicyclic group is preferably a hydrocarbon group, and is even more preferably a saturated hydrocarbon group (an alicyclic group).

Examples of suitable monocyclic alicyclic groups include groups in which one hydrogen atom has been removed from a cycloalkane. Examples of suitable polycyclic alicyclic groups include groups in which one hydrogen atom has been removed from a bicycloalkane, tricycloalkane or tetracycloalkane or the like.

Specifically, examples of suitable monocyclic alicyclic groups include a cyclopentyl group or cyclohexyl group. Examples of suitable polycyclic alicyclic groups include groups in which one hydrogen atom has been removed from a polycycloalkane such as adamantane, norbornane, isobornane, tricyclodecane or tetracyclododecane. Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a5) is preferably at least one unit selected from general formulas (I') to (III') shown below.

Furthermore, the structural unit (a5) is preferably a unit derived from an (α-lower alkyl)acrylate ester which contains an aforementioned cyclic alkoxyalkyl group at the ester portion, and more specifically, is preferably at least one structural unit selected from amongst units derived from an aliphatic polycyclic alkyloxy lower alkyl (α-lower alkyl)acrylate ester that may contain a substituent, such as a 2-adamantylmethyl group, 1-methyladamantoxymethyl group, 4-oxo-2-adamantoxymethyl group, 1-adamantoxyethyl group or 2-adamantoxyethyl group.

[Chemical Formula 8]

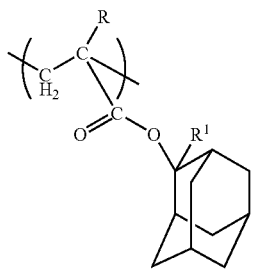

(I')

[In formula (I'), R represents a hydrogen atom or a lower alkyl group, and $R^1$ represents a lower alkyl group.]

[Chemical Formula 9]

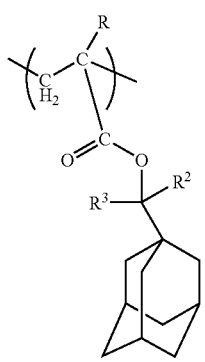

(II')

[In formula (II'), R represents a hydrogen atom or a lower alkyl group, and $R^2$ and $R^3$ each independently represents a lower alkyl group.]

[Chemical Formula 10]

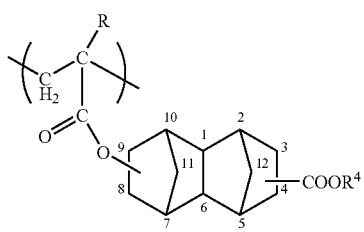

(III')

[In formula (III)', R represents a hydrogen atom or a lower alkyl group, and $R^4$ represents a tertiary alkyl group.]

In general formulas (I') to (III'), the hydrogen atom or lower alkyl group represented by R is the same as that described above in relation to the hydrogen atom or lower alkyl group bonded to the α-position of an acrylate ester. The lower alkyl group for R is preferably a linear or branched alkyl group of 1 to 5 carbon atoms, and specific examples include a methyl group, ethyl group, propyl group, isopropyl group, n-butyl group, isobutyl group, pentyl group, isopentyl group or neopentyl group. Of these, a methyl group is preferred industrially.

The lower alkyl group for $R^1$ is preferably a linear or branched alkyl group of 1 to 5 carbon atoms, and specific examples include a methyl group, ethyl group, propyl group, isopropyl group, n-butyl group, isobutyl group, pentyl group, isopentyl group and neopentyl group. Of these, a methyl group or ethyl group is preferred from the viewpoint of industrial availability.

The lower alkyl groups for $R^2$ and $R^3$ each preferably independently represents a linear or branched alkyl group of 1 to 5 carbon atoms. Of the various possibilities, those cases in which $R^2$ and $R^3$ are both methyl groups are preferred industrially. A structural unit derived from 2-(1-adamantyl)-2-propyl acrylate is a specific example.

The group $R^4$ is a chain-like tertiary alkyl group or a cyclic tertiary alkyl group, and preferably contains from 4 to 20 carbon atoms.

Examples of the chain-like tertiary alkyl group include a tert-butyl group or tert-amyl group, although a tert-butyl group is preferred industrially. A "tertiary alkyl group" refers to an alkyl group having a tertiary carbon atom.

Examples of the cyclic tertiary alkyl group include the same groups as those exemplified above in relation to the "acid dissociable, dissolution inhibiting group that contains an aliphatic cyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group and 1-methylcyclopentyl group.

Furthermore, the group —COOR$^4$ may be bonded to either position 3 or 4 of the tetracyclododecanyl group shown in the formula, although the bonding position cannot be further specified. Furthermore, in a similar manner, the carboxyl group residue of the acrylate structural unit may be bonded to either position 8 or 9 within the formula.

The structural unit (a5) may be used as either a single structural unit, or a combination of two or more different structural units.

The proportion of the structural unit (a5) within the (α-lower alkyl)acrylate ester resin component, relative to the combined total of all the structural units that constitute the (α-lower alkyl)acrylate ester resin component, is preferably within a range from 20 to 60 mol %, more preferably from 30 to 50 mol %, and is most preferably from 35 to 45 mol %. By ensuring that this proportion is at least 20 mol %, a favorable pattern can be obtained, whereas ensuring that the proportion is no greater than 60 mol % enables a favorable balance to be achieved with the other structural units.

The (α-lower alkyl)acrylate ester resin preferably also includes, in addition to the structural unit (a5) described above, a structural unit (a6) derived from an (α-lower alkyl) acrylate ester that contains a lactone ring. The structural unit (a6) is effective in improving the adhesion of the resist film to the substrate, and enhancing the hydrophilicity of the resin relative to a developing solution. Furthermore, the structural unit (a6) also enables the formation of a coating film that exhibits superior adhesion to the pattern.

In the structural unit (a6), a lower alkyl group or a hydrogen atom is bonded to the α-position carbon atom. The lower alkyl group bonded to the α-position carbon atom is the same as that described above for the lower alkyl group of the structural unit (a5), and is preferably a methyl group.

Examples of the structural unit (a6) include structural units in which a monocyclic group formed from a lactone ring or a polycyclic cyclic group that includes a lactone ring is bonded to the ester side-chain portion of an (α-lower alkyl)acrylate ester. The term lactone ring refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Examples of the structural unit (a6) include units that contain a monocyclic group in which one hydrogen atom has been removed from γ-butyrolactone, and units that contain a polycyclic group in which one hydrogen atom has been removed from a lactone ring-containing bicycloalkane.

Specifically, the structural unit (a6) is preferably at least one unit selected from general formulas (IV') through (VII') shown below.

[Chemical Formula 11]

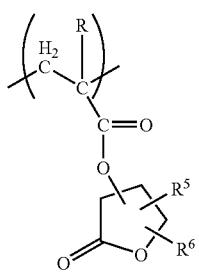

(IV')

[In general formula (IV'), R represents a hydrogen atom or a lower alkyl group, and $R^5$ and $R^6$ each independently represents a hydrogen atom or a lower alkyl group.]

[Chemical Formula 12]

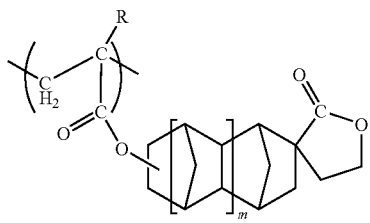

(V')

[In general formula (V'), R represents a hydrogen atom or a lower alkyl group, and m represents either 0 or 1.]

[Chemical Formula 13]

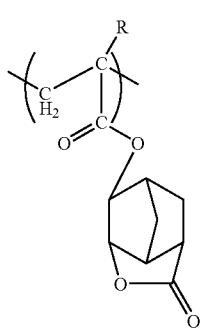

(VI')

[In general formula (VI'), R represents a hydrogen atom or a lower alkyl group.]

[Chemical Formula 14]

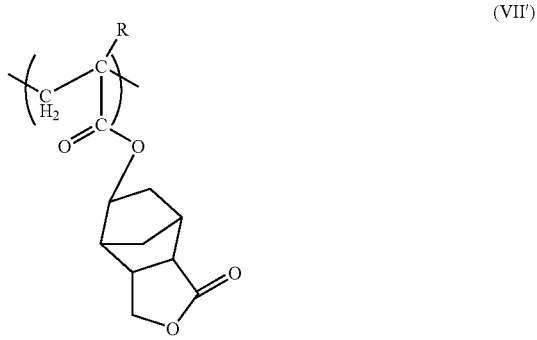

(VII')

[In general formula (VII'), R represents a hydrogen atom or a lower alkyl group.]

In general formulas (IV') to (VII'), the hydrogen atom or lower alkyl group for R is as defined for the hydrogen atom or lower alkyl group for R in the above general formulas (I') to (III').

In general formula (IV'), $R^5$ and $R^6$ each independently represents a hydrogen atom or a lower alkyl group, and preferably represent a hydrogen atom. The lower alkyl group for the groups $R^5$ and $R^6$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group, and neopentyl group. A methyl group is preferred industrially.

Furthermore, amongst the structural units represented by general formulas (IV') through (VII'), structural units represented by the general formula (IV') are low cost and therefore preferred industrially, and of the possible structural units represented by the formula (IV'), α-methacryloyloxy-γ-butyrolactone, in which R is a methyl group, $R^5$ and $R^6$ are both hydrogen atoms, and the position of the ester linkage between the methacrylate ester and the γ-butyrolactone is at the α-position on the lactone ring, is the most desirable.

The structural unit (a6) may be used as either a single structural unit, or a combination of two or more different structural units.

The proportion of the structural unit (a6) within the (α-lower alkyl)acrylate ester resin component, relative to the combined total of all the structural units that constitute the (α-lower alkyl)acrylate ester resin component, is preferably within a range from 20 to 60 mol %, more preferably from 20 to 50 mol %, and is most preferably from 30 to 45 mol %. Ensuring that this proportion is at least 20 mol % improves the lithography properties, whereas ensuring that the proportion is no greater than 60 mol % enables a favorable balance to be achieved with the other structural units.

The (α-lower alkyl)acrylate ester resin component preferably also includes, either in addition to the structural unit (a5) described above or in addition to the structural units (a5) and (a6), a structural unit (a7) derived from an (α-lower alkyl) acrylate ester that contains a polar group-containing polycyclic group.

Including the structural unit (a7) increases the hydrophilicity of the entire (α-lower alkyl)acrylate ester resin component, thereby improving the affinity with a developing solution, improving the alkali solubility within the exposed portions of the resist, and contributing to an improvement in the resolution. Furthermore, the structural unit (a7) also enables the formation of a coating film that exhibits superior adhesion to the pattern.

In the structural unit (a7), a lower alkyl group or a hydrogen atom is bonded to the α-position carbon atom. The lower alkyl group bonded to the α-position carbon atom is the same as that described above for the lower alkyl group of the structural unit (a5), and is preferably a methyl group.

Examples of the polar group include a hydroxyl group, cyano group, carboxyl group, or amino group or the like, although a hydroxyl group is particularly preferred.

Examples of the polycyclic group include polycyclic groups selected from amongst the aliphatic cyclic groups exemplified above in relation to the "acid dissociable, dissolution inhibiting group that contains an aliphatic cyclic group" within the aforementioned structural unit (a5).

The structural unit (a7) is preferably at least one unit selected from general formulas (VIII') through (IX') shown below.

[Chemical Formula 15]

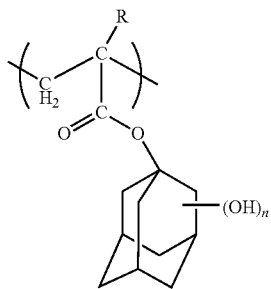

(VIII')

[In general formula (VIII'), R represents a hydrogen atom or a lower alkyl group, and n represents an integer of 1 to 3.]

In general formula (VIII'), R is as described above for R in general formulas (I') to (III').

In general formula (VIII'), structural units in which n is 1, and the hydroxyl group is bonded to position 3 of the adamantyl group are preferred.

[Chemical Formula 16]

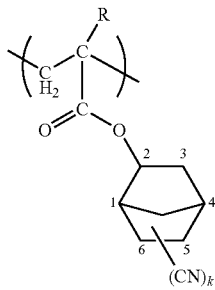

(IX')

[In general formula (IX'), R represents a hydrogen atom or a lower alkyl group, and k represents an integer of 1 to 3.]

In general formula (IX'), R is as described above for R in general formulas (I') to (III').

In general formula (IX'), structural units in which k is 1 are preferred. Furthermore, the cyano group is preferably bonded to position 5 or position 6 of the norbornyl group.

The structural unit (a7) may be used as either a single structural unit, or a combination of two or more different structural units.

The proportion of the structural unit (a7) within the (α-lower alkyl)acrylate ester resin component, relative to the combined total of all the structural units that constitute the (α-lower alkyl)acrylate ester resin component, is preferably within a range from 10 to 50 mol %, more preferably from 15 to 40 mol %, and is most preferably from 20 to 35 mol %. Ensuring that this proportion is at least 10 mol % improves the lithography properties, whereas ensuring that the proportion is no greater than 50 mol % enables a favorable balance to be achieved with the other structural units.

In the (α-lower alkyl)acrylate ester resin component, the combined total of these structural units (a5) through (a7), relative to the combined total of all the structural units that constitute the (α-lower alkyl)acrylate ester resin component, is preferably within a range from 70 to 100 mol %, and is more preferably from 80 to 100 mol %.

The (α-lower alkyl)acrylate ester resin component may include a structural unit (a8) besides the aforementioned structural units (a5) through (a7).

There are no particular restrictions on the structural unit (a8), which may be any other structural unit that cannot be classified as one of the above structural units (a5) through (a7).

For example, structural units that contain a polycyclic aliphatic hydrocarbon group and are derived from an (α-lower alkyl)acrylate ester are preferred. Suitable examples of the polycyclic aliphatic hydrocarbon group include polycyclic groups selected from amongst the aliphatic cyclic groups exemplified above in relation to the "acid dissociable, dissolution inhibiting group that contains an aliphatic cyclic group". In terns of factors such as industrial availability, at least one group selected from amongst a tricyclodecanyl group, adamantyl group, tetracyclododecanyl group, norbornyl group and isobornyl group is particularly preferred. The polycyclic aliphatic hydrocarbon group within the structural unit (a8) is most preferably a non-acid-dissociable group.

Specific examples of the structural unit (a8) include units having structures represented by general formulas (X) to (II) shown below.

[Chemical Formula 17]

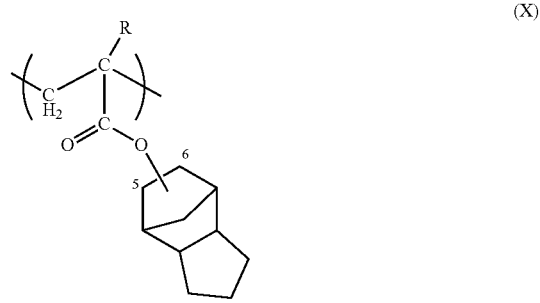

(X)

(wherein, R represents a hydrogen atom or a lower alkyl group.)

[Chemical Formula 18]

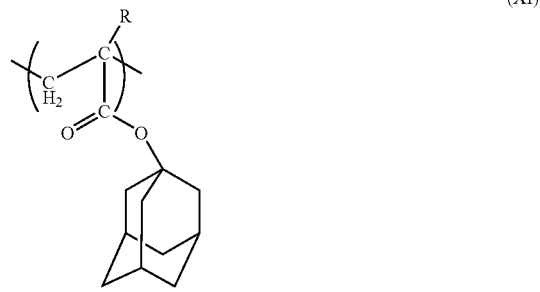

(XI)

(wherein, R represents a hydrogen atom or a lower alkyl group.)

[Chemical Formula 19]

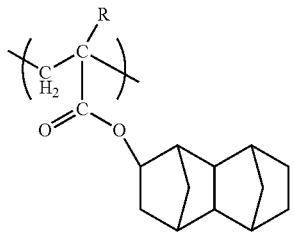

(XII)

(wherein, R represents a hydrogen atom or a lower alkyl group.)

In general formulas (X) to (XII), the hydrogen atom or lower alkyl group for R is as defined for the hydrogen atom or lower alkyl group for R in the above general formulas (I') to (III').

In those cases where a structural unit (a8) is included, the proportion of the structural unit (a8) within the (α-lower alkyl)acrylate ester resin component, relative to the combined total of all the structural units that constitute the (α-lower alkyl)acrylate ester resin component, is preferably within a range from 1 to 25 mol %, and is more preferably from 5 to 20 mol %.

The (α-lower alkyl)acrylate ester resin component is preferably a copolymer that includes at least the structural units (a5), (a6), and (a7). Examples of such copolymers include copolymers formed solely from the aforementioned structural units (a5), (a6) and (a7), and copolymers formed from the structural units (a5), (a6), (a7) and (a8).

The component (A-11) or the component (A-12) can be obtained by polymerizing the monomers corresponding with each of the structural units using a conventional method. For example, the component (A-1) or (A-12) can be obtained by a conventional radical polymerization or the like of the monomers corresponding with each of the structural units, using a radical polymerization initiator such as azobisisobutyronitrile (AIBN).

The weight average molecular weight (the polystyrene equivalent weight average molecular weight determined by gel permeation chromatography, this also applies below) of the component (A-1) is preferably not more than 30,000, more preferably not more than 20,000, and still more preferably 12,000 or lower. The lower limit for this range is typically 2,000, although from the viewpoints of inhibiting pattern collapse and achieving a favorable improvement in resolution and the like, the weight average molecular weight is preferably at least 4,000, and more preferably 5,000 or greater.

[Component (A-2)]

As the component (A-2), low molecular weight compounds having a molecular weight of at least 500 but not more than 2,000, containing a hydrophilic group, and also containing an acid dissociable, dissolution inhibiting group such as the group X or X' described above in relation to the component (A-1) are preferred. Specific examples include compounds containing a plurality of phenol structures in which a portion of the hydroxyl group hydrogen atoms have been substituted with the acid dissociable, dissolution inhibiting groups X or X'.

Preferred examples of the component (A-2) include low molecular weight phenol compounds in which a portion of the hydroxyl group hydrogen atoms have been substituted with the aforementioned acid dissociable, dissolution inhibiting groups. These types of compounds are known, for example, as sensitizers or heat resistance improvers for use in non-chemically amplified g-line or i-line resists, and any of these compounds may be used.

Examples of these low molecular weight phenol compounds include the compounds listed below.

Examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Of course this is not a restrictive list.

Similarly, there are no particular restrictions on the acid dissociable, dissolution inhibiting group, and suitable examples include the groups described above.

<Component (B)>

As the component (B), known materials used as acid generators in conventional chemically amplified resists can be used. Examples of these types of acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

Specific examples of onium salt-based acid generators include diphenyliodonium trifluoromethanesulfonate, (4-methoxyphenyl)phenyliodonium trifluoromethanesulfonate, bisp-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodoniun nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

Specific examples of suitable oxime sulfonate compounds include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Of these, α-(methylsulfonyloxyimino)-p-methoxyphenyl acetonitrile is preferred.

Specific examples of diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

As the component (B), either a single acid generator may be used alone, or a combination of two or more different acid generators may be used.

The quantity used of the component (B) is typically within a range from 1 to 20 parts by weight, and preferably from 2 to 10 parts by weight, per 100 parts by weight of the component (A). Ensuring that the quantity is at least as large as the lower limit of the above range enables favorable pattern formation, whereas ensuring that the proportion is no greater than the upper limit facilitates the production of a uniform solution, and enables favorable storage stability to be achieved.

<Optional Components>

In the chemically amplified resist composition, in order to improve the pattern shape and the post exposure stability of the latent image formed by the pattern-wise exposure of the resist layer, a nitrogen-containing organic compound (D) (hereafter also referred to as "component (D)") may be added as an optional component.

A multitude of these components (D) have already been proposed, and any of these known compounds may be used, although an amine, and in particular a secondary lower aliphatic amine or tertiary lower aliphatic amine, is preferred.

Here, a lower aliphatic amine refers to an alkyl or alkyl alcohol amine of 1 to 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and tertiary alkanolamines such as triethanolamine and triisopropanolamine are particularly preferred.

These compounds may be used either alone, or in combinations of two or more different compounds.

The component (D) is typically added in a quantity within a range from 0.01 to 5.0 parts by weight per 100 parts by weight of the component (A).

Furthermore, in the chemically amplified resist composition, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter also referred to as "component (E)") may also be added as another optional component. The component (D) and the component (E) can be used in combination, or either one can also be used alone.

As the organic carboxylic acid, compounds such as malonic acid, citric acid, malic acid, succinic acid, benzoic acid and salicylic acid are preferred.

Examples of the phosphorus oxo acid or derivative thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid. Of these, phosphonic acid is particularly preferred.

The component (E) is typically used in a quantity within a range from 0.01 to 5.0 parts by weight per 100 parts by weight of the component (A).

Other miscible additives can also be added to the chemically amplified resist composition according to need, including additive resins for improving the properties of the applied film of the resist composition, surfactants for improving the coating properties, dissolution inhibitors, plasticizers, stabilizers, colorants and halation prevention agents.

The chemically amplified resist composition can be prepared by dissolving the materials for the resist composition (the component (A), the component (B), and any of the other optional components as required) in an organic solvent (S) (hereafter, also referred to as "component (S)").

The organic solvent may be any solvent capable of dissolving the various components used to generate a uniform solution, and one or more solvents selected from known materials used as the solvents for conventional resist compositions can be used.

Specific examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol, and the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. Of these, PGMEA, EL, and propylene glycol monomethyl ether (PGME) are preferred. These organic solvents may be used either alone, or as a mixed solvent of two or more different solvents.

There are no particular restrictions on the quantity used of the component (S), and a quantity that produces a liquid having a concentration that is suitable for application to a support is used.

The pattern-forming method of the present invention includes: forming a first resist film by applying a first chemically amplified resist composition onto a support (hereafter frequently referred to as the "film formation step (1)"), forming a first resist pattern by selectively exposing the first resist film through a first mask pattern and then developing the first resist film (hereafter frequently referred to as the "patterning step (1)"), forming a coated pattern by forming a coating film composed of a metal oxide film on the surface of the first resist pattern (hereafter frequently referred to as the "coating step"), forming a second resist film by applying a second chemically amplified resist composition onto the support having the coated pattern formed thereon (hereafter frequently referred to as the "film formation step (2)"), and forming a pattern by selectively exposing the second resist film through a second mask pattern and then developing the second resist film (hereafter frequently referred to as the "patterning step (2)").

A preferred embodiment of the pattern-forming method of the present invention is described below with reference to FIG. 1. This embodiment represents an example in which positive resist compositions are used for both the first and second chemically amplified resist compositions.

Figure 1B:
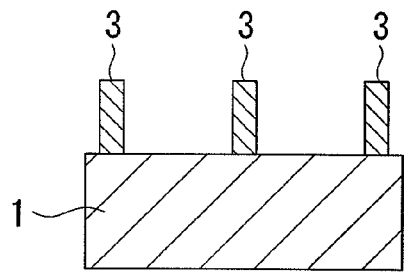
FIG. 1B is a schematic process diagram describing a preferred embodiment of the pattern-forming method of the present invention, and describes a patterning step (1).
Figure 1C:
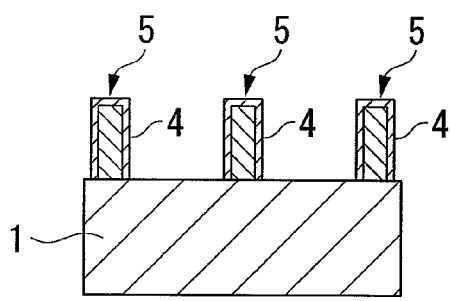
FIG. 1C is a schematic process diagram describing a preferred embodiment of the pattern-forming method of the present invention, and describes a coating step.
Figure 1D:
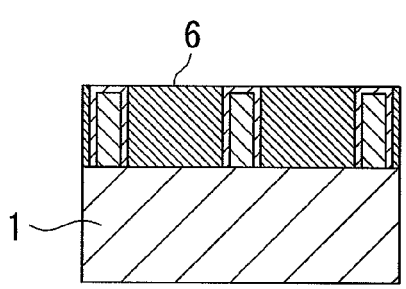
FIG. 1D is a schematic process diagram describing a preferred embodiment of the pattern-forming method of the present invention, and describes a film formation step (2).
Figure 1E:
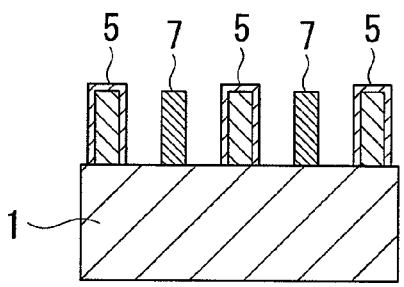
FIG. 1E is a schematic process diagram describing a preferred embodiment of the pattern-forming method of the present invention, and describes a patterning step (2).
Figure 2A:
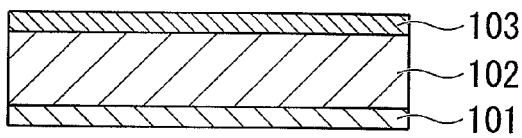
FIG. 2A is a schematic process diagram describing one example of a conventional double patterning method, and describes a laminate.
Figure 2B:
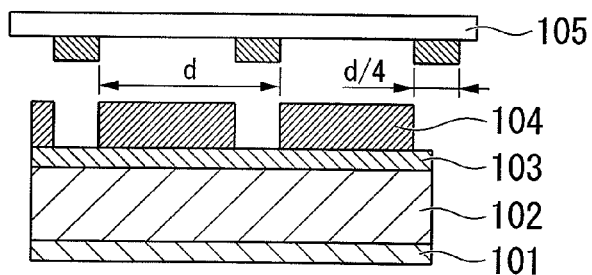
FIG. 2B is a schematic process diagram describing one example of a conventional double patterning method, and describes a method of forming a resist pattern in which a plurality of trench patterns having a space width of d/4 are arranged at a pitch of d.
Figure 2C:
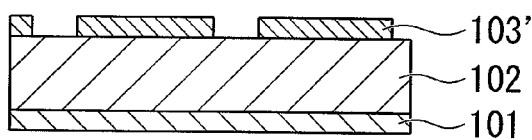
FIG. 2C is a schematic process diagram describing one example of a conventional double patterning method, and describes a method of forming a hard mask to which a resist pattern has been transferred.
Figure 2D:
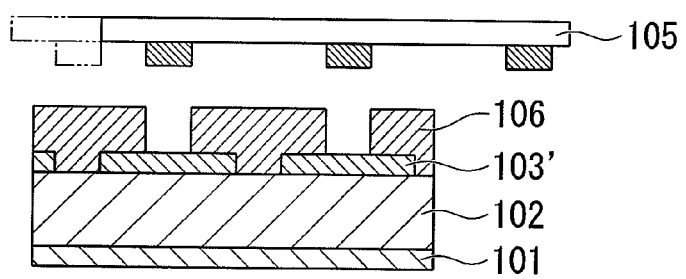
FIG. 2D is a schematic process diagram describing one example of a conventional double patterning method, and describes a method of forming a resist pattern by selectively exposing, through a shifted mask, a thick-film resist film having a thickness greater than the thickness of the hard mask, and then developing the resist film.
Figure 2E:
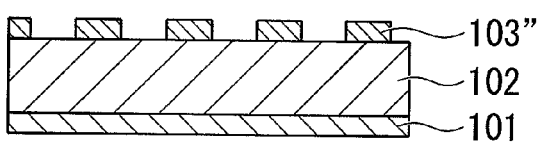
FIG. 2E is a schematic process diagram describing one example of a conventional double patterning method, and describes a method of forming a hard mask having a transferred pattern in which a plurality of trench patterns having a space width of d/4 are arranged at a pitch of d/2.
Figure 2F:
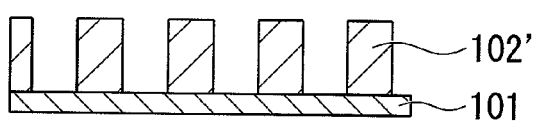
FIG. 2F is a schematic process diagram describing one example of a conventional double patterning method, and describes a method of forming a pattern in which the pitch is ½ of that of the mask that was used.

In this embodiment, first, as shown in FIG. 1A, a first chemically amplified resist composition is applied onto a support 1 to form a first resist film 2. Next, as shown in FIG. 1B, the first resist film 2 is selectively exposed and then developed, thereby forming a plurality of resist patterns 3. Subsequently, as shown in FIG. 1C, a coating film 4 composed of a metal oxide film is formed on the surface of each of the plurality of resist patterns 3, thereby forming a plurality of coated patterns 5. Next, as shown in FIG. 1D, a second chemically amplified resist composition is applied onto the support 1 having the plurality of coated patterns 5 formed thereon, thus forming a second resist film 6 that fills the spaces between the plurality of coated patterns 5. Subsequently, as shown in FIG. 1E, the second resist film 6 is selectively exposed in a different position from the position used for forming the plurality of coated patterns 5, and the second resist film 6 is then developed. This developing removes the exposed portions of the second resist film 6, and as a result, a pattern composed of a plurality of resist patterns 7 and the plurality of coated patterns 5 (hereafter, this type of pattern composed of a resist pattern and a coated pattern is frequently referred to as a "composite pattern") is formed on the support 1.

In this manner, a composite pattern with a narrower pitch than that of the resist pattern 3 formed in the patterning step (1) is able to be formed on the support 1.

A more detailed description of each of the steps is provided below.

[Film Formation Step (1)]

There are no particular restrictions on the support 1, and conventional supports can be used, including substrates for electronic componentry, as well as substrates on which a predetermined wiring pattern has already been formed. Specific examples of suitable supports include silicon wafers, substrates composed of a metal such as copper, chromium, iron or aluminum, and glass substrates. Suitable materials for the wiring pattern include copper, aluminum, nickel, and gold.

Further, as the support 1, an inorganic and/or organic film may be provided on the surface of an aforementioned substrate. Examples of inorganic films include inorganic antireflective films (inorganic BARC). Examples of organic films include organic antireflective films (organic BARC) and organic films such as the lower layer film in a multilayer resist method. If a lower layer film is provided, then a pattern having a high aspect ratio can be formed on the substrate, which is particularly desirable in the production and the like of semiconductors.

Here, a "multilayer resist method" describes a method in which at least one organic film (the lower layer film) and at least one resist film are provided on top of a substrate, and a resist pattern formed in the upper layer resist film is then used as a mask for conducting patterning of the lower layer, and is regarded as a method that is capable of forming patterns having a high aspect ratio. Multilayer resist methods can be basically classified as either methods that yield a two-layer structure composed of a resist film and a lower layer film, or methods that yield a multilayer structure of three or more layers in which one or more intermediate layers (such as thin metal films) are provided between the resist film and the lower layer film. According to a multilayer resist method, by using the lower layer film to ensure the desired level of thickness, the resist film can be formed as a very thin film, enabling the formation of a very fine pattern having a high aspect ratio.

In those cases where an organic film is provided, the organic film can be formed, for example, by using a spinner or the like to apply an organic film-forming material, prepared by dissolving a resin component or the like that forms the organic film in an organic solvent, to the surface of the substrate, and then conducting a bake treatment under conditions that include heating at a temperature that is preferably within a range from 200 to 300° C., for a period that is preferably from 30 to 300 seconds, and more preferably for 60 to 180 seconds.

The organic film-forming material is described in more detail below.

The thickness of the organic film is preferably within a range from 10 to 500 nm, and is more preferably from 50 to 450 nm. Ensuring a thickness within this range yields favorable effects, such as enabling the formation of a pattern with a high aspect ratio, and ensuring that a satisfactory level of etching resistance is obtained during etching of the substrate.

There are no particular restrictions on the first chemically amplified resist composition, which may be selected appropriately from the multitude of chemically amplified resist compositions that have been proposed as resist compositions, including the chemically amplified resist compositions described above.

The first chemically amplified resist composition may be either a positive resist composition or a negative resist composition, although the use of a positive resist composition is preferred.

The first resist film 2 can be formed by applying the first chemically amplified resist composition onto the support. Application of the first chemically amplified resist composition can be conducted by a conventional method using a spinner or the like.

Specifically, the first resist film 2 can be formed, for example, by using a spinner or the like to apply the first chemically amplified resist composition to the surface of the support, and then conducting a bake treatment (a prebake) under temperature conditions within a range from 80 to 150° C., for a period of 40 to 120 seconds and preferably for 60 to 90 seconds, to volatilize the organic solvent.

The thickness of the resist film 2 is preferably within a range from 50 to 500 nm, and is more preferably from 50 to 450 nm. Ensuring a thickness within this range yields favorable effects, such as enabling the formation of a resist pattern at a high resolution, and ensuring that a satisfactory level of resistance to etching is obtained.

[Patterning Step (1)]

The pattern step (1) can be conducted using conventional methods, for example, by selectively exposing the first resist film 2 through a mask having a predetermined pattern formed therein (namely, a mask pattern), and then conducting a bake treatment (PEB: post exposure baking) under temperature conditions within a range from 80 to 150° C., for a period of 40 to 120 seconds and preferably for 60 to 90 seconds. If alkali developing is then conducted using, for example, an aqueous solution of tetramethylammonium hydroxide (TMAH) with a concentration of 0.1 to 10% by weight, then in those cases where the resist composition used was a positive resist, the exposed portions are removed, whereas in those cases where a negative resist composition was used, the unexposed portions are removed, thereby forming the first resist pattern 3.

There are no particular restrictions on the radiation wavelength used for the exposure, and radiation from a KrF excimer laser, ArF excimer laser, $F_2$ excimer laser, EUV (extreme ultraviolet), VUV (vacuum ultraviolet), electron beam (EB), X-ray or soft X-ray can be used.

At this time, the selective exposure of the first resist film 2 may be conducted either using a normal exposure process (dry exposure), which is performed within air or an inert gas such as nitrogen, or using immersion exposure.

As described above, in immersion exposure, the exposure is conducted in a state where the region between the lens and the resist film formed on the wafer, which has conventionally been filled with air or an inert gas such as nitrogen, is filled with a solvent (a liquid immersion medium) having a larger refractive index than the refractive index of air.

More specifically, immersion exposure can be performed by filling the region between the resist film obtained in the manner described above and the lens at the lowermost point of the exposure apparatus with a solvent (the immersion medium) that has a larger refractive index than the refractive index of air, and then conducting exposure (immersion exposure) through a desired mask pattern in this state.

The immersion medium is preferably a solvent that has a refractive index that is larger than the refractive index of air but smaller than the refractive index of the resist film formed using the first chemically amplified resist composition described above. The refractive index of the solvent is not particularly limited as long at it satisfies this range.

Examples of this solvent that has a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, and which have a boiling point that is preferably within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and an example of a suitable perfluoroalkylamine compound is perfluorotributylamine (boiling point: 174° C.).

[Coating Step]

Subsequently, a coating film 4 including a metal oxide film is formed on each of the plurality of first resist patterns 3 that have been formed, thus forming a plurality of coated patterns 5.

In terms of the method used for forming the coating film 4, a method that uses a metal oxide film-forming material containing a metal compound (W) and an organic solvent (S'), prepared by dissolving the metal compound (W) in the organic solvent (S'), is preferred. According to this method, the metal oxide film can be formed at a low temperature (for example, room temperature (20 to 25° C.)).

The metal oxide film-forming material is described below in detail in the description relating to the metal oxide film-forming material of the present invention.

When this metal oxide film-forming material is used, the coating film 4 can be formed, for example, by applying the metal oxide film-forming material to the pattern surface to form a coating film, and subsequently drying the coating film. At this time, during the period from formation of the coating film until drying is complete, the metal compound (W) within the coating film gradually hydrolyzes to form hydroxyl groups under the action of moisture within the air, and these hydroxyl groups then undergo a dehydration-condensation, thereby forming a thin film of a metal oxide (the coating film) on the surface of the pattern. In those cases where, as described below, the metal oxide film-forming material includes an organic substance, the formed coating film is a composite thin film of the organic substance and the metal oxide (a thin-film composite film).

During this process, if the resist pattern 3 contains reactive groups (preferably hydroxyl groups or carboxyl groups) that are capable of reaction with the functional groups of the metal compound (W) contained within the film-forming material, then these reactive groups and the functional groups (such as isocyanate groups) of the metal compound (W) either react or adsorb, thereby favorably strengthening the bonding between the resist pattern 3 and the coating film 4.

From the viewpoint of controlling the reactivity, the operation of forming the coating film 4 is preferably conducted under an inert gas atmosphere. In such a case, if the atmosphere contains no moisture, then the hydrolysis treatment described below must be conducted in order to form the film.

The method used for applying the metal oxide film-forming material can employ a conventional method, and examples of suitable methods include a method in which the support 1 with the resist pattern 3 formed thereon is dipped in the metal oxide film-forming material (a dip coating method), and a method in which the metal oxide film-forming material is applied to the support 1 using a spin coating method. Furthermore, the coating film may also be formed using methods such as an alternate adsorption method.

The temperature during application of the metal oxide film-forming material to the support 1 (the coating temperature) differs depending on the activity of the metal compound (W) being used, and cannot be readily generalized, but is typically set within a range from 0 to 100° C.

Furthermore, the time elapsed from application of the metal oxide film-forming material to the support 1 until drying (including application, and if necessary, washing and other treatments such as adsorption), namely the contact time between the pre-hydrolysis coating film and the pattern, and the temperature (the contact temperature) during that time period differ depending on the activity of the metal compound (W) being used, and cannot be readily generalized, although generally, the time period is within a range from several seconds to several hours, and the temperature is usually set within the same range as that specified above for the coating temperature.

There are no particular restrictions on the method used for drying the coating film, and conventional methods can be used. For example, a bake treatment may be conducted, a drying gas such as nitrogen gas may be used, or in those cases where application of the metal oxide film-forming material is conducted using a spinner, drying may also be conducted by spin drying.

In the present invention, conducting a bake treatment is particularly preferred. Conducting a bake treatment improves the uniformity of the film thickness of the coating film 4 formed on the surface of the resist pattern 3. It is thought that the reason for this observation is that by conducting a bake treatment, cross-linking occurs either between the plurality of hydroxyl groups generated by hydrolysis of the metal compound (W) that exists within the coating film, or between the hydroxyl groups and the surface of the pattern, thereby making the coating film more dense, and improving the strength of the coating film and the adhesion of the film to the pattern surface.

In the bake treatment, the lower limit for the bake temperature is preferably 100° C. or higher, more preferably 110° C. or higher, and still more preferably 120° C. or higher. Provided the bake temperature is at least 100° C., a stronger coating film 4 can be formed. It is thought that this is because a temperature of at least 100° C. facilitates the cross-linking between the plurality of hydroxyl groups generated by hydrolysis of the metal compound (W), or between the hydroxyl groups and the resist pattern 3.

Although there are no particular restrictions on the upper limit for the bake temperature, the temperature should be set with due consideration of factors such as the heat resistance of the material that constitutes the resist pattern 3 being coated, and is preferably not more than 200° C., more preferably 190° C. or lower, and still more preferably 170° C. or lower.

Although there are no particular restrictions on the bake time, if consideration is given to the effects of the post-coating bake treatment and the stability of the pattern shape, then the bake time is preferably within a range from 30 to 300 seconds, and more preferably from 60 to 180 seconds.

In the coating step, following application of the metal oxide film-forming material, the surface of the support 1 is preferably washed with an organic solvent (S"). By conducting this washing, any excess metal compound (W) adhered to portions on the substrate surface where the resist film does not exist (namely, unpatterned portions) is either washed away by the organic solvent (S") or reduced to an extremely low concentration. In contrast, the metal compound (W) bonded to the surface of the resist pattern 3 is retained due to its powerful bonding to the pattern. As a result, a metal oxide film (the coating film 4) is formed satisfactorily on the surface of the resist pattern 3, whereas almost no metal oxide film is formed on the surface of the unpatterned portions on the support 1, meaning the metal oxide film (the coating film 4) can be formed on the surface of the resist pattern 3 with a high degree of coating selectivity.

Moreover, by conducting this washing, the coating film 4 becomes a more uniform layer with a very thin film thickness. In other words, by conducting washing, excess metal compound (W) on the resist pattern 3 that is not adsorbed chemically is removed. On the other hand, the metal compound (W) that is bonded comparatively strongly to the surface of the pattern via chemical adsorption or the like remains in a uniform coating on the pattern surface. As a result, a thin metal oxide film at the nanometer level can be formed with a uniform film thickness, at an extremely high level of precision, and with excellent reproducibility.

As the organic solvent (S"), any solvent having no functional groups that react with the metal compound (W) may be used, and the solvent may be selected from amongst conventional organic solvents.

Because the solvent is applied to the resist pattern 3, the organic solvent (S") is preferably a solvent that does not dissolve the resist pattern 3. This ensures that when the organic solvent (S") is applied to the surface of the resist pattern 3, the shape of the resist pattern is unlikely to be damaged.

As the organic solvent (S"), use of the same solvents as those exemplified below for the organic solvent (S') in the metal oxide film-forming material is preferred. This further enhances the effects described above.

The washing can be conducted using a conventional method, and examples include a method in which the organic solvent (S") is supplied to the surface of the coating film formed from the metal oxide film-forming material using a spraying method or the like, and the excess organic solvent (S") is then suctioned off under reduced pressure, a method in which the coating film is washed by dipping in the organic solvent (S"), a spray cleaning method, a steam cleaning method, or a method in which the organic solvent (S") is applied to the support using a spin coating method. A spin coating method is particularly preferred.

The washing conditions (such as the wash time and the quantity used of the organic solvent (S")) may be set appropriately in accordance with factors such as the washing method employed and the nature of the organic solvent (S").

For example, when washing is conducted using a spin coating method, the washing conditions may be set such that the spin speed is within a range from 100 to 5,000 rpm, and the wash time is within a range from 1 to 100 seconds.

The washing is preferably conducted before the organic solvent (S') within the coating film formed from the metal oxide film-forming material has volatilized completely. A determination as to whether or not this solvent (S') has volatilized completely can be made by visual inspection.

In this step, if required, a treatment such as a standing period may be introduced following application of the metal oxide film-forming material to form the coating film and before drying is conducted, in order to promote the chemical adsorption and/or physical adsorption between the resist pattern 3 and the metal compound (W) within the coating film.

Further, in this step, a hydrolysis treatment may be conducted in the period following formation of the coating film and before drying is conducted, by bringing the coating film into contact with water, thereby causing hydrolysis of the metal compound (W) on the film surface, and generating hydroxyl groups at the film surface. As described below, this operation facilitates the formation of a coating film in which a plurality of coating films are laminated on top of one other, enabling the thickness of the coating film to be readily adjusted. In other words, the hydroxyl groups generated at the surface of the coating film and the metal compound (W) within the coating film formed by applying additional film-forming material react to generate a powerful bond, meaning a coating film in which a plurality of coating films are laminated on top of one other can be obtained.

The method used for conducting the hydrolysis treatment can employ conventional methods without any particular restrictions. For example, a sol-gel method in which the coating film is brought into contact with water is the most common. More specific examples include methods in which water is applied to the surface of the coating film, and methods in which the laminate containing the formed coating films is dipped in an organic solvent containing a small quantity of water.

In those cases where the film-forming material contains a compound that exhibits high reactivity relative to water as the metal compound (W), leaving the coating film to stand in the atmosphere causes the metal compound (W) to hydrolyze by reacting with the water vapor in the atmosphere, meaning even if a separate hydrolysis treatment is not conducted, hydrolysis proceeds naturally.

In order to prevent the introduction of impurities and the like, and enable generation of a metal oxide of high purity, deionized water is preferably used as the water.

Furthermore, in the hydrolysis treatment, the time required for completing the treatment can be significantly reduced by using a catalyst such as an acid or a base.

The thickness of the coating film 4 is preferably at least 0.1 nm, is more preferably within a range from 0.5 to 50 nm, and is most preferably from 1 to 30 nm. By ensuring the thickness is at least 0.1 nm, favorable resistance to etching, and particularly dry etching such as oxygen plasma etching, can be achieved.

The thickness of the coating film 4 can be adjusted, for example, by repeating the steps for application, washing and hydrolysis treatment of the metal oxide film-forming material. In other words, by repeating the series of operations including applying the metal oxide film-forming material to form a coating film, washing the coating film, allowing a standing period if required, and then conducting a hydrolysis treatment, a uniform thin film of the desired thickness can be formed.

By employing this type of operation, a coating film with a thickness from several nm to several tens of nm, and depending on conditions a thickness of up to several hundred nm, can be formed with superior precision.

For example, in those cases where a film-forming material is used that includes a metal alkoxide with a single metal atom, such as silicon tetraisocyanate or titanium butoxide, as the metal compound (W), appropriate adjustment of the contact conditions enables thin films with a thickness of several angstroms (wherein 1 angstrom=0.1 nm) to be sequentially laminated on top of one another. In this case, increases in the film thickness per cycle correspond with the number of repetitions of film formation using the metal oxide film-forming material. On the other hand, when fine particles of an alkoxide gel or the like are used as the metal compound (W), a thin film with a thickness of approximately 60 nm can be laminated within each cycle. Furthermore, in those cases where a spin coating method is used to form the coating film of the metal oxide film-forming material, appropriate adjustment of factors such as the solvent used, the concentration of the metal compound (W) and the spin speed enable the film thickness to be arbitrarily controlled within a range from several nm to approximately 200 nm.

In this case, by altering the metal compound (W) used within each cycle, a coating film 4 can be obtained in which thin films of different metal oxides are laminated on top of one another.

[Film Formation Step (2)]

Next, a second chemically amplified resist composition is applied to the support 1 having the plurality of coated patterns 5 formed thereon, thus forming the second resist film 6 that fills the spaces between the plurality of coated patterns 5.

In the present embodiment, a positive resist composition is used as the second chemically amplified resist composition. In those cases where a positive resist composition is also used for the first chemically amplified resist composition in the aforementioned film formation step (1), the first chemically amplified resist composition and the second chemically amplified resist composition may be either the same or different.

In a similar manner to the first resist film 2, the second resist film 6 may be formed using conventional methods.

The film thickness of the second resist film 6 is preferably either equal to the height of the coated patterns 5 or thicker than the coated patterns 5. In other words, when the support 1 is viewed from the side of the second resist film 6, the surface preferably appears flat.

[Patterning Step (2)]

Subsequently, the second resist film 6 is selectively exposed in a different position from the position used for forming the plurality of coated patterns 5, and the second resist film 6 is then developed. This process forms a composite pattern on the support 1, the pattern being composed of the plurality of coated patterns 5 and a plurality of newly formed resist patterns 7 in the second resist film 6.

In the present invention, any case in which the exposure position does not exactly coincide with the coated pattern formed in the coating step is described as a "different position from the position used for forming the coated pattern", and this includes both cases in which there is absolutely no overlap, and cases in which partial overlap exists.

In the present invention, there is preferably absolutely no overlap between the position at which the coated pattern is formed and the position at which selective exposure is conducted in the patterning step (2). This ensures that a narrow-pitch pattern can be formed in which the spacing between patterns (the pitch) is narrower than that of the resist pattern formed in the pattern step (1).

The selective exposure at a different position from the position used for forming the coated pattern can be conducted, for example, by moving the mask pattern used in the patterning step (1) in a horizontal direction.

This movement of the mask pattern can be executed by altering the program of the exposure apparatus being used.

The mask pattern may be moved in parallel in a single direction, or may be rotated. For example, when forming a pattern, a line and space mask pattern having a plurality of lines arranged at a constant pitch may be used to form a line and space pattern in the patterning step (1), and subsequently, in the patterning step (2), by moving the mask pattern in a direction parallel to the direction perpendicular to the direction of the lines, and forming line patterns in positions midway between the individual line patterns formed in the patterning step (1), a line and space composite pattern is formed with a pitch that is approximately ½ of the pitch in the original line and space pattern.

For example, by forming a line and space pattern in which the line width is 100 nm and the ratio of line width: space width=1:3, subsequently moving the mask pattern 200 nm in a direction perpendicular to the direction of the lines, and once again forming a line and space pattern in which the line width is 100 nm and the ratio of line width:space width 1:3, a line and space pattern can be formed in which the line width is 100 nm and the ratio of line width:space width=1:1.

Furthermore, by subjecting the mask pattern used in the patterning step (1) to a rotational movement, or by using a mask pattern that is different from the mask pattern used in the patterning step (1), a multitude of composite patterns can be formed.

Besides the methods that involve moving the mask pattern, other methods that may be used include methods that involve moving the stage (the base on which the substrate is mounted) within the exposure apparatus.

In the pattern-forming method of the present invention, following completion of the pattern step (2) described above, a second coating step may be conducted to form a coating film composed of a metal oxide film on the surface of the formed composite pattern. This step enables those resist patterns 7 within the composite pattern that were formed using the second resist film 6 to be coated with a coating film formed from a metal oxide film, thereby improving the etching resistance and the like.

In the pattern-forming method of the present invention, following the pattern step (2) described above, the series of operations composed of the coating step, the film formation step (2) and the patterning step (2) may be repeated a plurality of times.

In other words, the operation of forming a coated pattern by forming a coating film composed of a metal oxide film on the surface of the formed composite pattern, forming a resist film by applying a chemically amplified resist composition to the support having the coated pattern formed thereon, selectively exposing the resist film, and then developing the resist film to form a composite pattern may be conducted a plurality of times. This enables the formation of patterns with even narrower pitches, or the formation of patterns having complex shapes.

In the pattern-forming method of the present invention, following completion of the pattern step (2) described above, the formed composite pattern may be used as a mask to conduct etching of the support 1.

In other words, in those cases where an organic film is provided on top of the substrate, etching of the organic film can be conducted, and a pattern (an organic film pattern) that is faithful to the composite pattern can be formed in the organic film, and these patterns (the composite pattern and the organic film pattern) can then be used as a mask to conduct etching of the substrate. In those cases where the composite pattern is formed directly on the substrate, the composite pattern can simply be used as a mask for conducting etching of the substrate. By etching the substrate in this manner, a semiconductor device or the like can be produced.

The etching method may use conventional methods, and for example in the case of etching of an organic film, dry etching is preferred. In terms of ensuring that the coating film has a high level of resistance to the etching, and achieving favorable production efficiency, oxygen plasma etching or etching using $CF_4$ gas or $CHF_3$ gas is preferred, and of these, oxygen plasma etching is particularly desirable.

Etching of the substrate is preferably conducted by etching using a halogen gas or etching using a fluorocarbon-based gas, and etching using either $CF_4$ gas or $CHF_3$ gas is particularly desirable.

[Organic Film-forming Material]

In the support 1 used in the film formation step (1) described above, an organic film-forming material used for forming the organic film that may be formed on top of the substrate need not necessarily exhibit the type of sensitivity to an electron beam or light source shown by a resist film. The types of resists or resins typically used in the production of semiconductor devices and liquid crystal display elements may be used.

Furthermore, in order to enable the coated pattern that has been coated with the coating film to be used for etching the organic film, thereby transferring the coated pattern to the organic film and forming an organic film pattern, the organic film-forming material is preferably a material that is capable of forming an organic film that can be subjected to etching, and particularly dry etching.

Of the various possibilities, materials that are capable of forming an organic film that can be etched by oxygen plasma etching or the like are particularly preferred.

As this type of organic film-forming material, the materials conventionally used for forming organic films such as organic BARC are suitable. Examples include the ARC series of products manufactured by Brewer Science Ltd., the AR series of products manufactured by Rohm and Haas Company, and the SWK series of products manufactured by Tokyo Ohka Kogyo Co., Ltd.

Of these, in those cases where, as described above, oxygen plasma etching is used in the etching step, the organic film is preferably formed using a material that is readily etched using oxygen plasma etching, but exhibits comparatively high resistance to halogen gases, and specifically fluorocarbon gases such as $CF_4$ gas or $CHF_3$ gas.

Furthermore, an organic film containing at least one resin component selected from the group consisting of novolak resins, acrylic resins and soluble polyimides may also be formed between the above organic BARC and the substrate.

These materials are ideal for the present invention as they are readily etched by oxygen plasma etching or the like, and also display favorable resistance to fluorocarbon gases. In other words, because etching of the substrate or the like is generally conducted using a halogen gas such as a fluorocarbon gas, by forming the organic film from these types of materials, oxygen plasma etching can be used to improve the processability during formation of the organic film pattern, while the etching resistance can be improved in subsequent steps that use a halogen gas such as a fluorocarbon gas to conduct etching of the substrate.

These resin components may be used either alone, or in combinations of two or more different resin components.

Of these materials, novolak resins, and acrylic resins containing an alicyclic region or aromatic ring on a side chain are cheap, widely used, and exhibit excellent resistance to dry etching using a fluorocarbon gas, and are consequently preferred.

As the novolak resin, any of the resins typically used in positive resist compositions can be used, and positive resists for i-line or g-line radiation containing a novolak resin as the primary component can also be used.

A novolak resin is a resin obtained, for example, by conducting an addition condensation of an aromatic compound containing a phenolic hydroxyl group (hereafter, simply referred to as a "phenol") and an aldehyde, in the presence of an acid catalyst.

Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallate esters, α-naphthol, and β-naphthol.

Examples of the aldehyde include formaldehyde, furfural, benzaldehyde, nitrobenzaldehyde, and acetaldehyde.

There are no particular restrictions on the catalyst used in the addition condensation reaction, and suitable acid catalysts include hydrochloric acid, nitric acid, sulfuric acid, formic acid, oxalic acid, and acetic acid.

Commercially available products can be used as the novolak resin.

The lower limit for the weight average molecular weight (Mw) of the novolak resin is preferably at least 3,000, more preferably at least 5,000, still more preferably at least 6,000, and is most preferably 7,000 or higher. The upper limit is preferably not more than 50,000, more preferably not more than 30,000, still more preferably not more than 10,000, and is most preferably 9,000 or less.

Provided the value of Mw is at least 3,000, the resin is unlikely to sublime when baked at high temperatures, and therefore unlikely to contaminate the apparatus and the like. Furthermore, ensuring that the value of Mw is 5,000 or greater yields a superior level of etching resistance to fluorocarbon gases and the like.

Furthermore, provided the value of Mw is not more than 50,000, the resin exhibits favorable filling properties for substrates having very fine unevenness, whereas a value of Mw of 10,000 or less tends to facilitate dry etching.

Novolak resins with a Mw value of 5,000 to 50,000, and preferably from 8,000 to 30,000, in which the quantity of low molecular weight substances with a molecular weight of not more than 500, and preferably not more than 200, as measured by a gel permeation chromatography method (GPC method), is not more than 1% by weight, and is preferably 0.8% by weight or less, are preferred. The quantity of the low molecular weight substances is preferably as small as possible, and is most preferably 0% by weight.

In a novolak resin having a Mw value within the above range, ensuring that the quantity of low molecular weight substances with a molecular weight of not more than 500 is 1% by weight or less yields favorable filling properties for substrates having very fine unevenness. The reason why such a reduction in the low molecular weight fraction should improve the filling characteristics remains unclear, although it is surmised that it is a reflection of the degree of dispersion.

Here, the expression "low molecular weight substances with a molecular weight of not more than 500" refers to substances that are detected as a low molecular weight fraction of molecular weight 500 or less during GPC analysis using polystyrene standards. These "low molecular weight substances with a molecular weight of not more than 500" include unpolymerized monomers, and low polymerization degree materials, which vary depending on the molecular weight, but include, for example, materials produced by the condensation of 2 to 5 phenol molecules with an aldehyde.

The quantity (weight %) of these low molecular weight substances with a molecular weight of not more than 500 is measured by graphing the results of the above GPC analysis with the fraction number across the horizontal axis and the concentration along the vertical axis, and then determining the ratio (%) of the area under the curve within the low molecular weight fraction for molecular weights of not more than 500, relative to the area under the entire curve.

As the acrylic resin, any of the resins typically used in positive resist compositions can be used, and suitable examples include acrylic resins containing structural units derived from a polymerizable compound containing an ether linkage, and structural units derived from a polymerizable compound containing a carboxyl group.

Examples of the polymerizable compound containing an ether linkage include (meth)acrylate derivatives containing both an ether linkage and an ester linkage such as 2-methoxyethyl(meth)acrylate, methoxytriethylene glycol(meth)acrylate, 3-methoxybutyl(meth)acrylate, ethylcarbitol(meth)acrylate, phenoxypolyethylene glycol (meth)acrylate, methoxypolypropylene glycol(meth)acrylate, and tetrahydrofurfuryl (meth)acrylate. These compounds may be used either alone, or in combinations of two or more different compounds. In the description of the present invention, the term "(meth)acrylate" refers to either one or both of the acrylate and the methacrylate. Further, the term "(meth) acrylic acid" refers to one or both of acrylic acid, in which a hydrogen atom is bonded to the α-position, and methacrylic acid, in which a methyl group is bonded to the α-position. The "α-position (the carbon atom on the α-position)" refers to the carbon atom having the carbonyl group bonded thereto, unless specified otherwise.

Examples of the polymerizable compound containing a carboxyl group include monocarboxylic acids such as acrylic acid, methacrylic acid, and crotonic acid; dicarboxylic acids such as maleic acid, fumaric acid, and itaconic acid; and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid, although of these, acrylic acid and methacrylic acid are preferred. These compounds may be used either alone, or in combinations of two or more different compounds.

The soluble polyimide refers to a polyimide that can be converted to liquid form using an organic solvent.

If desired, other miscible additives can also be added to the organic film-forming material. Examples of such miscible additives include additive resins for improving the properties of the organic film, surfactants for improving the coating properties, dissolution inhibitors, plasticizers, stabilizers, colorants and halation prevention agents.

The organic film-forming material can be prepared by dissolving the materials such as the aforementioned resin component within an organic solvent. As the organic solvent, the same solvents as those exemplified above for the component (S) of the aforementioned chemically amplified resist composition may be used.

A hard mask layer formed from a silicon-based material may be used between the resist film and the organic film.

<<Metal Oxide Film-forming Material>>

A metal oxide film-forming material of the present invention (hereafter frequently referred to as simply "the film-forming material") includes a metal compound (W) capable of generating a hydroxyl group upon hydrolysis, and an organic solvent (S'), is prepared by dissolving the metal compound (W) in the organic solvent (S'), and is used for forming the coating film in the pattern-forming method of the present invention described above.

<Metal Compound (W)>

The metal compound (W) is a compound capable of generating a hydroxyl group upon hydrolysis.

When a film-forming material containing such a metal compound (W) is applied to the surface of a resist film, or is applied to the surface and then coated with water, and preferably deionized water, the metal compound (W) reacts with the moisture in the atmosphere or the applied water and generates hydroxyl groups by hydrolysis, even at low temperatures (for example, approximately room temperature). Subsequently, the generated hydroxyl groups undergo a dehydration-condensation, thereby binding a plurality of molecules of the metal compound (W) together, and forming a dense metal oxide film with a high film density. This dense film contains a metal, and consequently exhibits excellent etching resistance, and furthermore, is capable of forming a coating at low temperatures, meaning the shape of the resist pattern being coated is not damaged.

Moreover, because the resist pattern includes reactive groups such as carboxyl groups and hydroxyl groups at the pattern surface, these reactive groups at the pattern surface and the hydroxyl groups generated from the metal oxide (W) react (via dehydration-condensation or adsorption or the like), thus forming a strongly bound coating film on the surface of the resist pattern.

Examples of compounds that can be used as the metal compound (W) include metal compounds containing a functional group that can generate a hydroxyl group upon hydrolysis.

The functional group is preferably bonded directly to the metal atom.

The number of these functional groups is preferably at least two for each metal atom, is even more preferably within a range from 2 to 4, and is most preferably 4. Ensuring that the compound contains at least two of these functional groups means that the hydroxyl groups generated by hydrolysis undergo dehydration-condensation, thereby binding a plurality of molecules of the metal compound (W) together in a continuous manner to form a strong metal oxide film.

Examples of functional groups that can generate a hydroxyl group upon hydrolysis include alkoxy groups, an isocyanate group, and a carbonyl group. Furthermore, because halogen atoms also have a similar function, halogen atoms are also included within the functional groups of the present invention.

Examples of the alkoxy groups include linear or branched alkoxy groups of 1 to 5 carbon atoms such as a methoxy group (—O—Me), ethoxy group (—O-Et), n-propoxy group (—O-nPr), isopropoxy group (—O-iPr), and n-butoxy group (—O-nBu).

Examples of the halogen atoms include a chlorine atom, fluorine atom, bromine atom and iodine atom, although of these, a chlorine atom is preferred.

In those cases where the film-forming material is applied to a resist pattern to form a metal oxide film (the coating film), if reactive groups such as carboxyl groups or hydroxyl groups exist at the resist pattern surface, then of the above groups, alkoxy groups and an isocyanate group are particularly preferred as they undergo a condensation reaction with these reactive groups. As a result, the hydroxyl groups formed following hydrolysis and the reactive groups on the resist pattern surface undergo a condensation reaction, thereby binding the coating film strongly to the surface of the resist pattern.

In those cases where the film-forming material is applied to a resist pattern to form a coating film, if reactive groups such as carboxyl groups or hydroxyl groups exist at the resist pattern surface, then of the above groups, a carbonyl group and halogen atoms are particularly preferred as they adsorb to the reactive groups. As a result, the hydroxyl groups formed following hydrolysis and the reactive groups on the pattern surface undergo adsorption, thereby binding the coating layer strongly to the surface of the resist pattern.

Of the above groups, an isocyanate group and halogen atoms (and particularly a chlorine atom) are preferred, as they exhibit a high level of activity and can readily form a coating film even without conducting a heat treatment, and of these, an isocyanate group is particularly desirable.

In the present invention, metals that can be used within the metal compound (W) include not only typical metals, but also boron, silicon, germanium, antimony, selenium, and tellurium and the like.

Examples of preferred metals for forming the metal compound (W) include titanium, zirconium, aluminum, niobium, silicon, boron, lanthanide, yttrium, barium, cobalt, iron, zirconium and tantalum, and of these titanium and silicon are particularly preferred, and silicon is the most desirable.

Furthermore, the number of metal atoms within the metal compound (W) may be either one, or two or greater, although one atom is preferred.

The metal compound (W) may also include other atoms or organic groups besides the "functional group that can generate a hydroxyl group upon hydrolysis" described above. Other atoms include, for example, a hydrogen atom. Other organic groups include, for example, alkyl groups (and preferably lower alkyl groups of 1 to 5 carbon atoms), and an ethyl group or methyl group is preferred.

In this description and within the scope of the appended claims, unless stated otherwise, the term "alkyl group" includes linear, branched and cyclic monovalent saturated hydrocarbon groups.

Examples of the metal compound (W) include the compounds listed below.

Examples of metal compounds containing an alkoxy group (hereafter also referred to as "metal alkoxides") include the compounds below.

For example, metal alkoxide compounds of metals other than rare earth metals, such as titanium butoxide (TiO-nBu)$_4$), zirconium propoxide (Zr(O-nPr)$_4$), aluminum butoxide (Al(O-nBu)$_3$), niobium butoxide (Nb(O-nBu)$_5$), silicon tetramethoxide (Si(O—Me)$_4$), and boron ethoxide (B(O-Et)$_3$);

metal alkoxide compounds of rare earth metals, such as lanthanide isopropoxide (Ln(O-iPr)$_3$) and yttrium isopropoxide (Y(O-iPr)$_3$);

double alkoxide compounds such as barium titanium alkoxide (BaTi(OR$^{60}$)$_x$) (wherein, R$^{60}$ represents a lower alkyl group of 1 to 5 carbon atoms, and X represents an integer from 2 to 4);

metal alkoxide compounds containing two or more alkoxy groups and an organic group other than an alkoxy group, such as methyltrimethoxysilane (MeSi(O—Me)$_3$) and diethyldiethoxysilane (Et$_2$Si(O-Et)$_2$); and metal alkoxide compounds containing a ligand such as acetylacetone, and two or more alkoxy groups, are mentioned.

Furthermore, fine particles of alkoxide sols or alkoxide gels obtained by adding a small quantity of water to one of the above metal alkoxides to effect a partial hydrolysis and condensation can also be used.

Moreover, binuclear or cluster-type alkoxide compounds containing a plurality of metal atoms or a plurality of different metal elements, such as titanium butoxide tetramer (C$_4$H$_9$O[Ti(OC$_4$H$_9$)$_2$O]$_4$C$_4$H$_9$), and polymers based on metal alkoxide compounds, which have undergone one-dimensional cross-linking via oxygen atoms, are also included within the above metal alkoxides.

As the metal compound containing an isocyanate group, compounds containing two or more isocyanate groups are preferred, and compounds represented by the general formula M(NCO)$_X$ (wherein, M represents a metal atom, and X represents an integer from 2 to 4) are particularly desirable.

Specific examples include tetraisocyanatosilane (Si(NCO)$_4$), titanium tetraisocyanate (Ti(NCO)$_4$), zirconium tetraisocyanate (Zr(NCO)$_4$), and aluminum triisocyanate (Al(NCO)$_3$).

As the metal compound containing a halogen atom, halogenated metal compounds containing two or more (and preferably 2 to 4) halogen atoms are preferred, and halogenated metal compounds containing two or more (and preferably from 2 to 4) halogen atoms represented by the general formula M(X$_1$)$_{n1}$ (wherein, M represents a metal atom, X$_1$ represents one type of atom selected from amongst a fluorine atom, chlorine atom, bromine atom and iodine atom, and n1 represents an integer from 2 to 4) are particularly preferred. The compound containing a halogen atom may also be a metal complex.

Specific examples include tetrachlorotitanium (TiCl$_4$) and tetrachlorosilane (SiCl$_4$). An example of a metal complex is cobalt chloride (CoCl$_2$).

Examples of the metal compound containing a carbonyl group include metal carbonyl compounds such as titanium oxoacetylacetate (TiO(CH$_3$COCH$_2$COO)$_2$) and pentacarbonyl iron (Fe(CO)$_5$), as well as polynuclear clusters of these compounds.

Amongst the above compounds, silicon compounds containing two or more (and preferably from 2 to 4) isocyanate groups and/or halogen atoms are particularly preferred, as they exhibit a high level of activity, and can readily form a metal oxide film with superior etching resistance even without conducting a heat treatment. Silicon compounds containing two or more (and preferably 2 to 4) isocyanate groups are particularly desirable.

The number of silicon atoms within each molecule of this silicon compound may be either one, or two or greater, although one atom is preferred. Of these compounds, compounds represented by general formula (w-1) shown below are preferred.

$$SiW_a \qquad (w\text{-}1)$$

[wherein, a represents an integer of 2 to 4, W represents an isocyanate group (an NCO group) or a halogen atom, and the plurality of W groups may be either the same or mutually different.]

In the formula (w-1), a represents an integer from 2 to 4, and is most preferably 4.

W represents an isocyanate group or a halogen atom, and examples of the halogen atom include the same atoms listed above, although a chlorine atom is preferred. Of these, an isocyanate group is particularly preferred.

The metal compound (W) may be used as either a single compound, or a mixture of two or more different compounds.
Organic Solvent (S')>

The film-forming material is prepared by dissolving the metal compound (W) in the organic solvent (S').

In the present invention, the organic solvent (S') preferably includes a solvent (S'1) that has no functional groups that undergo reaction with the metal compound (W), as such solvents yield superior effects for the present invention.

As the solvent (S'1), any solvent that contains no functional groups that react with the metal compound (W), and is capable of dissolving the metal compound (W) can be used, and the solvent may be selected from conventional organic solvents.

As mentioned above, example of functional groups that react with the metal compound (W) include groups containing a carbon-carbon double bond such as a vinyl group, as well as a hydroxyl group, carboxyl group and halogen atoms. Provided the solvent (S'1) contains none of these functional groups, the metal compound (W) exists stably within the solvent (S'), yielding excellent film forming capabilities.

In the present invention, the solvent (S'1) preferably has a boiling point of at least 155° C. Using such a solvent ensures a more favorable coating selectivity, meaning the surface of the resist pattern can be coated selectively. Further, because the surface of the resist pattern can be coated selectively, the etching selectivity ratio relative to the substrate beneath the unpatterned portions of the resist pattern (namely, the portions where the resist does not exist) and the portions of the organic film such as the organic BARC formed on the substrate (hereafter, these portions may be referred to jointly as "the unpatterned substrate portions") can be improved.

In the present description, the "etching selectivity ratio" refers to the apparent difference in etching rate between the coated pattern and the unpatterned substrate portions when the unpatterned substrate portions are subjected to etching using the resist pattern that has been coated with the metal oxide film (namely, the coated pattern) as a mask.

Typically, when the film-forming material is applied to the pattern surface, and particularly in those cases where an organic film such as an organic BARC has been provided on the substrate, the coating selectivity is poor, causing the surfaces of the unpatterned substrate portions to also be coated with a metal oxide film. As a result, when etching is then conducted using the pattern that has been coated with the metal oxide film (the coated pattern) as a mask, etching of the unpatterned substrate portions is inhibited by the metal oxide film, meaning a problem arises in that a satisfactory etching selectivity ratio can not be achieved between the coated pattern and the unpatterned substrate portions.

However, by using the solvent (S'1) described above, the coating selectivity is improved, enabling an improvement in the etching selectivity ratio relative to the unpatterned portions. It is thought that the reason for this favorable etching selectivity ratio is that when the film-forming material containing the solvent (S'1) is applied to the pattern, the solvent (S'1) undergoes almost no volatilization, and is retained on the pattern, during the period through until the metal compound (W) undergoes hydrolysis to generate a film. In other words, during the process in which etching is conducted using the pattern formed on the substrate as a mask, following application of the film-forming material to the pattern to form a coating film, if the solvent within the coating film volatilizes before the metal compound (W) hydrolyzes to form a film, then the metal compound (W) may undergo physical adsorption to form a metal oxide film not only at the surface of the pattern, but also at the surface of the unpatterned substrate portions, thereby lowering the apparent etching selectivity ratio. However, it is thought that by including the solvent (S'1) with a boiling point of at least 155° C., volatilization of the organic solvent (S') is suppressed, thereby addressing the above problems.

In particular and as described below, if following the application of the film-forming material, the surface is washed (subjected to a rinse treatment), then the etching selectivity ratio relative to the unpatterned substrate portions improves even further. It is surmised that this observation is due to the fact that because the solvent (S') is retained and undergoes almost no volatilization in the period prior to washing, the metal compound (W) on the surface of the pattern, which has undergone comparatively strong adhesion via chemical adsorption or the like, remains adhered to the pattern even when subjected to washing, whereas the metal compound (W) on the surface of the unpatterned substrate portions, which is adhered comparatively weakly by physical adsorption or the like, is removed by the washing process, and that as a result, almost no metal oxide film is formed on the surface of the unpatterned substrate portions.

The boiling point of the solvent (S'1) is preferably at least 160° C., and more preferably 165° C. or higher. Although there are no particular restrictions on the upper limit for the boiling point, if due consideration is given to factors such as the coating properties, then the boiling point is preferably not more than 300° C., and is more preferably 250° C. or lower.

The solvent (S'1) is preferably an aliphatic compound, as such compounds yield superior effects for the present invention.

The aliphatic compound may be either a chain-like compound that contains no rings within the structure, or a cyclic compound that contains a ring within the structure, and a cyclic compound is preferred. Furthermore, the cyclic compound is preferably a hydrocarbon, and is most preferably a saturated hydrocarbon.

Examples of this type of cyclic compound include monocycloalkanes, polycycloalkanes such as bicycloalkanes, tricycloalkanes and tetracycloalkanes, and compounds in which a substituent group such as an alkyl group is bonded to a ring of one of these compounds. The alkyl group substituent is preferably a linear or branched alkyl group, and is more preferably a lower alkyl group of 1 to 5 carbon atoms. The alkyl group substituent may also be bonded to another carbon atom on the basic ring of the cyclic compound, different from the carbon atom to which the alkyl group is bonded, thereby forming another ring.

As the chain-like compound, compounds such as n-hexane (boiling point: approximately 69° C.) and n-heptane (boiling point: approximately 98° C.) may be exemplified.

Examples of the cyclic compound include compounds represented by general formula (s'-1) shown below.

Furthermore, as the solvent (S'1), selection of a solvent that has minimal impact on the environment is also preferred.

Examples of this type of solvent include solvents for which the starting raw materials are natural materials.

Examples of solvents for which the starting raw materials are natural materials include terpene-based solvents (including monocyclic monoterpenes such as p-menthane, o-menthane and m-menthane, and bicyclic monoterpenes such as pinane, which are described below) obtained from essential oil component of plants.

Moreover, in the present invention, because the film-forming material is used for coating a resist pattern, the solvent (S'1) is preferably selected so as not to dissolve the resist pattern. By selecting such a solvent, the resist pattern shape is less likely to deteriorate during formation of the coating film on the resist pattern surface using the film-forming material.

As the solvent (S'1), compounds represented by general formula (s'-1) shown below (hereafter also referred to as "compound (s'-1)") are particularly preferred, as they do not react with the metal compound (W), yield superior effects for the present invention, have minimal impact on the environment, and do not dissolve resist patterns.

[Chemical Formula 20]

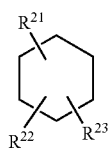

(s'-1)

[wherein, $R^{21}$ to $R^{23}$ each independently represents a hydrogen atom or a linear or branched alkyl group, at least two of $R^{21}$ to $R^{23}$ represent alkyl groups, and those alkyl groups may be bonded to a carbon atom within the cyclohexane ring other than the carbon atom to which the alkyl group is bonded, thereby forming a ring.]

In formula (s'-1), of the groups $R^{21}$ to $R^{23}$, at least two groups are linear or branched alkyl groups. In other words, in the compound (s'-1), either two of the groups $R^{21}$ to $R^{23}$ may be linear or branched alkyl groups, with the other group being a hydrogen atom, or all of the groups $R^{21}$ to $R^{23}$ may be linear or branched alkyl groups. In the present invention, compounds in which two of the groups $R^{21}$ to $R^{23}$ are linear or branched alkyl groups are preferred.

The linear or branched alkyl groups represented by $R^{21}$ to $R^{23}$ are preferably lower alkyl groups of 1 to 5 carbon atoms, and are even more preferably alkyl groups of 1 to 3 carbon atoms. Specific examples include a methyl group, ethyl group, propyl group, isopropyl group, n-butyl group, isobutyl group, pentyl group, isopentyl group, and neopentyl group. Of these, a methyl group or isopropyl group is preferred.

The two or more alkyl groups represented by $R^{21}$ to $R^{23}$ may be either the same or different.

In the present invention, at least one of the groups $R^{21}$ to $R^{23}$ is preferably a branched alkyl group, and compounds in which one of the groups is an isopropyl group are particularly preferred.

Compounds containing both an isopropyl group and a methyl group are particularly desirable as the compound (s'-1).

The alkyl groups represented by $R^{21}$ to $R^{23}$ may be bonded to a carbon atom within the cyclohexane ring other than the carbon atom to which the alkyl group is bonded, thereby forming a ring.

Here, the description that the alkyl group may be "bonded to a carbon atom within the cyclohexane ring other than the carbon atom to which the alkyl group is bonded, thereby forming a ring" means that a group produced by removing a single hydrogen atom from the alkyl group (namely, an alkylene group) links the carbon atom on the cyclohexane ring to which the alkyl group is bonded, and another carbon atom.

There are no particular restrictions on the bonding positions of $R^{21}$ to $R^{23}$, although compounds in which at least two alkyl groups are bonded to either positions 1 and 4 (the para position) or positions 1 and 3 (the meta position) of the cyclohexane ring are preferred.

Specific examples of the compound represented by the formula (s'-1) include p-menthane (boiling point: approximately 170° C.), m-menthane (boiling point: approximately 170° C.), o-menthane (boiling point: approximately 170° C.), and pinane (boiling point: approximately 169° C.). The structures of these compounds are shown below.

In the present invention, the case in which the solvent (S'1) is p-menthane is particularly preferred, as it results in superior effects for the present invention.

[Chemical Formula 21]

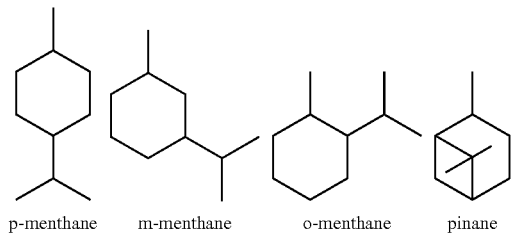

p-menthane    m-menthane    o-menthane    pinane

The solvent (S'1) may be used as either a single compound, or a mixture of two or more different compounds.

The proportion of the solvent (S'1) within the organic solvent (S') is preferably within a range from 50 to 100% by weight, is more preferably from 80 to 100% by weight, and is most preferably 100% by weight In the present invention, the organic solvent (S') may also include a solvent (S'2) other than the solvent (S'1), namely a solvent that contains a functional group that reacts with the metal compound (W), provided inclusion of this other solvent does not impair the effects of the present invention.

Examples of the solvent (S'2) include alcohols such as methanol, ethanol and propanol, and aromatic compounds such as toluene, benzene and cumene, and from the viewpoint of enabling formation of a dense film, cumene (boiling point: approximately 152° C.) is preferred.

The solvent (S'2) may be used as either a single compound, or a mixture of two or more different compounds.

There are no particular restrictions on the quantity used of the organic solvent (S'), although the quantity is preferably sufficient to generate a molar concentration within the film-forming material (the concentration of the combination of the metal compound (W) and any other organic compounds described below, which may be used according to need) within a range from approximately 1 to 200 mM, more preferably from 50 to 150 mM, and most preferably from 50 to 100 mM. Ensuring a molar concentration within this range enables the formation of a more uniform film, and is consequently preferred.

<Optional Components>

Other optional components may also be added to the film-forming material in addition to the metal compound (W) and the organic solvent (S').

Examples of these optional components include organic compounds. Adding such compounds means composite films of the metal oxide and the organic compound can be formed.

There are no particular restrictions on the organic compound, provided it dissolves in the solvent (S') described above. Here, the term "dissolves" is not limited to those cases in which the lone organic compound dissolves in isolation, but also includes cases such as 4-phenylazobenzoic acid, which dissolves in solvents such as choroform upon formation of a complex with a metal alkoxide.

There are no particular restrictions on the molecular weight of the organic compound.

From the viewpoints of further increasing the strength of the coating film and the adhesion of the coating film to the pattern, the use of an organic compound that contains a plurality of reactive groups (preferably hydroxyl groups or carboxyl groups) and is a solid at room temperature (25° C.) is preferred.

Examples of this type of organic compound that can be used favorably include polymer compounds containing hydroxyl groups or carboxyl groups such as polyacrylic acid, polyvinyl alcohol, polyvinylphenol, polymethacrylic acid and polyglutamic acid; polysaccharides such as starch, glycogen, and colominic acid, disaccharides and monosaccharides such as glucose and mannose, and porphyrin compounds and dendrimers and the like that contain hydroxyl groups or carboxyl groups at the terminals.

Furthermore, cationic polymer compounds can also be used favorably as the organic compound. Metal alkoxides and metal oxides can undergo an anionic interaction with the cations of cationic polymer compounds, enabling strong bonds to be realized.

Specific examples of cationic polymer compounds include PDDA (polydimethyldiallylammonium chloride), polyethyleneimine, polylysine, chitosan, and dendrimers containing amino groups at the terminals.

These organic compounds function as structural components for forming thin films with a high degree of mechanical strength. Furthermore, the organic compounds can also perform the roles of a functional site for imparting functionality to the resulting thin film, or as a component for forming a void within the thin film that matches the molecular shape of the organic compound, by removing the compound following film formation.

The organic compound may be used as either a single compound, or a mixture of two or more different compounds.

In those cases where an organic compound is added, the blend quantity is preferably within a range from 0.1 to 50 parts by weight, and more preferably from 1 to 20 parts by weight, per 100 parts by weight of the metal compound (W).

Furthermore, in order to further improve the stability of the material over time, an unsaturated ether compound disclosed in Japanese Unexamined Patent Application, First Publication No. 2004-315771 may also be added to the film-forming material of the present invention.

In the present invention, by using the type of film-forming material described above, a uniform film (the coating film) can be formed on the surface of the resist pattern at low temperature and with a high degree of etching resistance.

As a result, when etching of the substrate or the organic film provided on the substrate is conducted using the coated pattern having the above coating film as a mask, the coated pattern can be transferred faithfully to the substrate or the organic film without damaging the pattern shape. Further, because a pattern that is faithful to the coated pattern can be transferred to an organic film, a pattern with a high aspect ratio can be formed. The "aspect ratio" describes the ratio of the height of the pattern relative to the width of the bottom portion of the pattern (closest to the substrate).

Further, because a metal oxide film of uniform film thickness can be formed on the surface of the resist pattern, when the coated pattern that has been coated with the metal oxide film is used as a mask to conduct etching of the substrate or the like, thereby transferring the coated pattern, the shape of the pattern formed on the substrate or the like exhibits superior resolution and the like.

Furthermore, because coating of the resist pattern can be conducted using a low-temperature treatment (the coating film may be formed by conducting a heat treatment, although the coating film can also be formed without conducting a heat treatment), and the treatment method is simple, an improvement in production efficiency and a reduction in costs can be achieved. This treatment can be applied to the coating of all manner of resist patterns.

<<Method for Using Metal Oxide Film-forming Material>>

A method for using the metal oxide film-forming material of the present invention is a method of using a metal oxide film-forming material prepared by dissolving, in an organic solvent (S'), a metal compound (W) capable of generating a hydroxyl group upon hydrolysis, wherein in a pattern-forming method including: forming a first resist film by applying a first chemically amplified resist composition onto a support, forming a first resist pattern by selectively exposing the first resist film through a first mask pattern and then developing the first resist film, forming a coated pattern by forming a coating film including a metal oxide film on the surface of the first resist pattern, forming a second resist film by applying a second chemically amplified resist composition onto the support having the coated pattern formed thereon, and forming a pattern by selectively exposing the second resist film through a second mask pattern and then developing the second resist film, the metal oxide film-forming material is used for forming the coating film.

Examples of the metal oxide film-forming material include the same materials as those described above for the metal oxide film-forming material of the present invention.

Further, the pattern-forming method that uses the metal oxide film-forming material can be conducted in the same manner as the pattern-forming method of the present invention described above, and the step of forming a coating film using the metal oxide film-forming material can be conducted in the same manner as the coating step described above for the pattern-forming method of the present invention.

As described above, in the pattern-forming method of the present invention, the surface of a first resist pattern formed in the patterning step (1) is coated with a metal oxide film that exhibits superior resistance to the organic solvent within the chemically amplified resist composition. As a result, even when a second chemically amplified resist composition is applied on top of the coated pattern, there is no chance of the organic solvent within the second chemically amplified resist composition dissolving the first resist pattern and causing a deterioration in the pattern shape.

Accordingly, in a conventional double patterning method, as shown in FIG. 2A through FIG. 2F, a lower layer film must be provided on the substrate, and then in order to form a pattern on the substrate, the resist film must be subjected to patterning at least twice, and the hard mask beneath must also be subjected to etching at least twice, whereas in the present invention, a lower layer film need not necessarily be provided, and a pattern can be formed on the substrate without conducting etching.

Further, in the present invention, a positive resist composition can be used for both of the patterning steps. In other words, if a first resist pattern is formed using a positive resist composition, and then a second positive resist composition is applied to the first resist pattern without first forming a coating film, then the organic solvent within the latterly applied second positive resist composition dissolves the first resist pattern. As a result, until now, application of a positive resist composition to a resist pattern formed using a positive resist composition has been impossible. However, in the present invention, by forming the coating film, the first resist pattern is protected from the organic solvent, and two positive resist compositions can be used in combination to form the pattern.

Moreover, according to the pattern-forming method of the present invention, very fine patterns can be formed even using existing exposure apparatus and existing chemically amplified resist compositions.

Furthermore, the metal oxide film-forming material and the method for using the metal oxide film-forming material according to the present invention enable a metal oxide film that exhibits excellent resistance to the organic solvents used within chemically amplified resist compositions and excellent etching resistance to be formed uniformly at low temperature on the surface of a resist pattern, and are therefore ideal for application to the aforementioned pattern-forming method of the present invention.

In other words, conventionally, chemical vapor deposition methods (hereafter also referred to as CVD methods) and SOG (spin-on-glass) methods and the like have been used for forming silica based coating films such as $SiO_2$ films. An SOG method is a method in which, generally, a solution (hereafter also referred to as a "SOG solution") prepared by dissolving a silicon compound in an organic solvent is applied and then subjected to a heat treatment, thereby forming a film containing $SiO_2$ as the main component (hereafter also referred to as a "SOG coating film") (see, for example, Japanese Unexamined Patent Application, First Publication No. 2003-167346, Japanese Examined Patent Application, Second Publication No. Hei 08-3074, Japanese Patent (Granted) Publication No. 2,739,902 and Japanese Patent (Granted) Publication No. 3,228,714).

Metal oxide films such as these silica-based coating films are considered to exhibit excellent etching resistance, but a variety of problems arise if an attempt is made to form this type of metal oxide film on the surface of a resist pattern. For example, in order to obtain a high-quality metal oxide film with superior etching resistance, if a CVD method or SOG method is used, then baking at a high temperature of at least 400° C. must be performed in order to ensure that a dense metal oxide coating film is obtained, but this type of high-temperature process is both time-consuming and expensive, and suffers from poor production efficiency. Further, during coating of the metal oxide film onto the surface of the resist pattern, the type of high-temperature process described above tends to cause heat sag of the resist pattern being coated, and maintaining the shape of the resist pattern is problematic.

In contrast, according to the metal oxide film-forming material of the present invention described above, the metal oxide film can be formed at a comparatively low temperature that enables the shape of the resist pattern to be retained.

EXAMPLES

Reference Example 1

An ArF resist composition TArF-TS185C (manufactured by Tokyo Ohka Kogyo Co., Ltd.) was spin coated onto an 8-inch silicon substrate, and was then subjected to a prebake (PAB) at 105° C. for 60 seconds, thereby forming a resist film having a film thickness of 300 nm. Subsequently, this resist film was selectively exposed through a mask, using an ArF excimer laser exposure apparatus NSR-S302 manufactured by Nikon Corporation (NA=0.6, σ=0.75). A post exposure baking (PEB) treatment was then conducted at 110° C. for 60 seconds, and the resist film was then developed for 60 seconds using a 2.38% by weight aqueous solution of tetramethylammonium hydroxide. As a result, a resist pattern (hereafter referred to as "pattern (1)") in which a contact hole pattern of holes with an internal diameter of 160 nm were arranged with equal spacing therebetween was formed in the resist film.

In a separate preparation, tetraisocyanatosilane (Si $(NCO)_4$) was dissolved in sufficient p-menthane to generate a solution of 100 mM, thus yielding a metal oxide film-forming material.

This metal oxide film-forming material was applied uniformly by spin coating (10 seconds at 100 rpm) to the surface of the pattern (1), washing was conducted using p-menthane (15 seconds at 500 rpm), spin drying was then conducted at 2,000 rpm for 10 seconds and then at 3,000 rpm for 10 seconds, and a baking treatment was then conducted at 120° C. for 90 seconds. As a result, a uniform coating film (a silicon oxide film ($SiO_2$)) was coated onto the surface of the pattern (1), thus forming a coated pattern. Subsequently, a FIB processing apparatus (FIB-2100, manufactured by Hitachi High-Technologies Corporation) was used to process the film surface, and when the film thickness of the coating film was then measured using a Hitachi ultra thin film evaluation apparatus HD2300 (manufactured by Hitachi High-Technologies Corporation), the thickness was found to be 4 nm at any location on the substrate.

The above results confirm that by using the metal oxide film-forming material of the present invention, a coating film can be formed with excellent in-plane uniformity of the film thickness.

Example 1

Using the sequence described below, a pattern was formed using the same steps as those shown in FIG. 1A to FIG. 1E.

A resist composition (1) was prepared by dissolving 100 parts by weight of a resin represented by general formula (1) shown below (Mw=6,000, Mw/Mn=2.0), 4.0 parts by weight of triphenylsulfonium nonafluorobutanesulfonate, 3.5 parts of tri(4-tert-butylphenyl)sulfonium nonafluorobutanesulfonate, and 0.6 parts by weight of triethanolamine in 2,300 parts by weight of a mixed solvent of PGMEA and EL (with a weight ratio of 6:4).

[Chemical Formula 22]

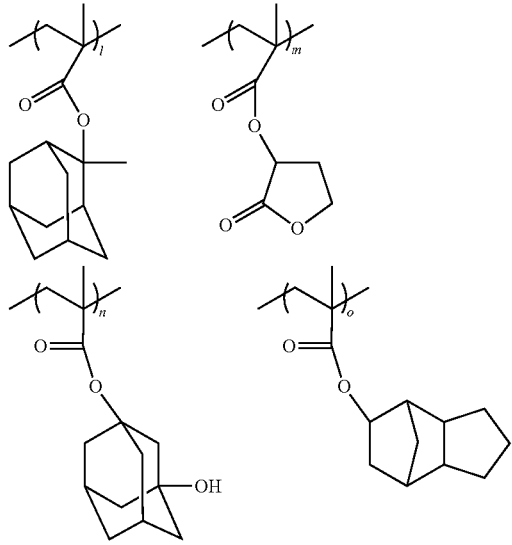

(1)

This resist composition was spin coated onto an 8-inch silicon substrate, and was then subjected to a prebake (PAB)

at 115° C. for 90 seconds, thereby forming a resist film having a film thickness of 150 nm. This resist film was then selectively exposed through a mask, using an ArF excimer laser exposure apparatus NSR-S302 (manufactured by Nikon Corporation, NA=0.60). A post exposure baking (PEB) treatment was then conducted at 120° C. for 90 seconds, and the resist film was then developed for 30 seconds using a 2.38% by weight aqueous solution of tetramethylammonium hydroxide. As a result, a resist pattern (hereafter referred to as "pattern (1)") in which line patterns having a line width of 100 nm were arranged with an equal spacing therebetween (pitch: 1,000 nm) was formed in the resist film.

In a separate preparation, tetraisocyanatosilane (Si(NCO)$_4$) was dissolved in sufficient p-menthane to generate a solution of 100 mM, thus yielding a metal oxide film-forming material.

This metal oxide film-forming material was applied uniformly by spin coating (10 seconds at 100 rpm) to the surface of the pattern (1), washing was conducted using p-menthane (15 seconds at 500 rpm), spin drying was then conducted at 2,000 rpm for 10 seconds and then at 3,000 rpm for 10 seconds, and a baking treatment was then conducted at 120° C. for 90 seconds. As a result, a uniform coating film (a silicon oxide film (SiO$_2$)) was coated onto the surface of each line pattern within the pattern (1), thus forming a coated line pattern. The film thickness of the coating film was approximately 1 nm.

Subsequently, the mask of the ArF excimer laser exposure apparatus was displaced by 0.5 μm, and using the same conditions as those described above, the resist composition (1) was once again applied to the substrate having the coated line pattern formed thereon, and then subjected to a PAB treatment to form a resist film. This resist film was then exposed and developed using the same conditions as those described above.

As a result, even after the second patterning, the coated line pattern suffered no dissolution and was able to retain its shape from prior to application of the resist composition, and line patterns having a line width of 100 nm were formed in the spaces between each of the plurality of coated line patterns.

INDUSTRIAL APPLICABILITY

The present invention is able to provide a novel pattern-forming method that enables a reduction in the number of steps in a double patterning method, a metal oxide film-forming material that can be used favorably in the pattern-forming method, and a method for using the metal oxide film-forming material, and is therefore extremely useful industrially.

The invention claimed is:

1. A pattern-forming method, comprising:
forming a first resist film by applying a first chemically amplified resist composition onto a support;
forming a first resist pattern by selectively exposing said first resist film through a first mask pattern and then developing said first resist film;
forming a coated pattern by forming a coating film including a metal oxide film on a surface of said first resist pattern;
forming a second resist film by applying a second chemically amplified resist composition onto said support having said coated pattern formed thereon; and
forming a pattern by selectively exposing said second resist film through a second mask pattern and then developing said second resist film, wherein said coating film is formed using a metal oxide film-forming material, which includes a metal compound (W) capable of generating a hydroxyl group upon hydrolysis and an organic solvent (S'), and is prepared by dissolving said metal compound (W) in said organic solvent (S'),
wherein said metal compound (W) includes a silicon compound having two or more isocyanate groups.

2. The pattern-forming method according to claim 1, wherein the organic solvent (S') comprises a compound represented by general formula (s'-1) shown below:

(s'-1)

wherein, $R^{21}$ to $R^{23}$ each independently represents a hydrogen atom or a linear or branched alkyl group, at least two of $R^{21}$ to $R^{23}$ represent alkyl groups, and those alkyl groups may be bonded to a carbon atom within the cyclohexane ring other than the carbon atom to which the alkyl group is bonded, thereby forming a ring.

3. A metal oxide film-forming material,
which comprises a metal compound (W) capable of generating a hydroxyl group upon hydrolysis and an organic solvent (S'), is prepared by dissolving said metal compound (W) in said organic solvent (S'), wherein said metal compound (W) includes a silicon compound having two or more isocyanate groups,
wherein said film-forming material is used for forming said coating film in a pattern-forming method according to claim 1.

4. The metal oxide film-forming material according to claim 3, wherein the organic solvent (S') comprises a compound represented by general formula (s'-1) shown below:

(s'-1)

wherein, $R^{21}$ to $R^{23}$ each independently represents a hydrogen atom or a linear or branched alkyl group, at least two of $R^{21}$ to $R^{23}$ represent alkyl groups, and those alkyl groups may be bonded to a carbon atom within the cyclohexane ring other than the carbon atom to which the alkyl group is bonded, thereby forming a ring.

5. A method for using a metal oxide film-forming material, wherein
in a pattern-forming method comprising: forming a first resist film by applying a first chemically amplified resist composition onto a support, forming a first resist pattern by selectively exposing said first resist film through a first mask pattern and then developing said first resist film, forming a coated pattern by forming a coating film including a metal oxide film on a surface of said first resist pattern, forming a second resist film by applying a second chemically amplified resist composition onto said support having said coated pattern formed thereon, and forming a pattern by selectively exposing said second resist film through a second mask pattern and then developing said second resist film, said metal oxide film-forming material is used for forming said coating film, and said metal oxide film-forming material includes a metal compound (W) capable of generating a hydroxyl group upon hydrolysis and an organic solvent (S'), and is prepared by dissolving said metal compound (W) in said organic solvent (S'), wherein said metal compound (W) includes a silicon compound having two or more isocyanate groups.

6. The method for using a metal oxide film-forming material according to claim 5, wherein the organic solvent (S') comprises a compound represented by general formula (s'-1) shown below:

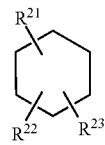

(s'-1)

wherein, $R^{21}$ to $R^{23}$ each independently represents a hydrogen atom or a linear or branched alkyl group, at least two of $R^{21}$ to $R^{23}$ represent alkyl groups, and those alkyl groups may be bonded to a carbon atom within the cyclohexane ring other than the carbon atom to which the alkyl group is bonded, thereby forming a ring.

* * * * *

UNITED STATES PATENT AND TRADEMARK OFFICE
CERTIFICATE OF CORRECTION

PATENT NO. : 8,349,543 B2
APPLICATION NO. : 12/373714
DATED : January 8, 2013
INVENTOR(S) : Shogo Matsumaru, Ryoji Watanabe and Toshiyuki Ogata It is certified that error appears in the above-identified patent and that said Letters Patent is hereby corrected as shown below:

In the Specifications:

In Column 4, Line 15, Change "material" to --material,--.

In Column 8, Line 55, Change "a lower" to --α-lower--.

In Column 13, Line 10, Change "mol %." --mol %--.

In Column 20, Line 26, Change "terns" to --terms--.

In Column 20, Line 33, Change "(II)" to --(XII)--.

In Column 21, Line 41, Change "(A-1)" to --(A-11)--.

In Column 22, Line 47, Change "bisp-tert-butylphenyl)iodonium" to --bis(p-tert-butylphenyl)iodonium--.

In Column 22, Line 52, Change "diphenyliodoniun" to --diphenyliodonium--.

In Column 25, Line 34-35, Change "antireffective" to --antireflective--.

In Column 27, Line 14, Change "at" to --as--.

In Column 37, Lines 56-57, Change "(TiO-nBu)$_4$)," to --(Ti(O-nBu)$_4$),--.

In Column 41, Line 25, Change "R$^<$to" to --R$^{21}$ to--.

In Column 41, Line 40, Change "R$^\leq$are" to --R$^{23}$ are--.

Signed and Sealed this
Twenty-seventh Day of August, 2013

Teresa Stanek Rea
*Acting Director of the United States Patent and Trademark Office*

CERTIFICATE OF CORRECTION (continued)
U.S. Pat. No. 8,349,543 B2

In Column 42, Line 32, Change "weight" to --weight.--.

In Column 43, Line 1, Change "choroform" to --chloroform--.